(12) United States Patent
Ravi et al.

(10) Patent No.: US 12,322,657 B2
(45) Date of Patent: Jun. 3, 2025

(54) WIDE BAND GAP SEMICONDUCTOR PROCESS, DEVICE, AND METHOD

(71) Applicant: ThinSiC Inc., Santa Clara, CA (US)

(72) Inventors: Tirunelveli Subramaniam Ravi, San Jose, CA (US); Hoeseok Lee, San Jose, CA (US); Bishnu Prasanna Gogoi, Scottsdale, AZ (US); Jinho Seo, Saratoga, CA (US)

(73) Assignee: ThinSiC Inc., Santa Clara, CA (US)

( * ) Notice: Subject to any disclaimer, the term of this patent is extended or adjusted under 35 U.S.C. 154(b) by 568 days.

(21) Appl. No.: 17/857,017

(22) Filed: Jul. 3, 2022

(65) Prior Publication Data

US 2024/0006242 A1  Jan. 4, 2024

(51) Int. Cl.
*H01L 21/78* (2006.01)
*H01L 21/02* (2006.01)
*H10D 8/01* (2025.01)
*H10D 8/60* (2025.01)
*H10D 62/832* (2025.01)

(52) U.S. Cl.
CPC .... *H01L 21/7813* (2013.01); *H01L 21/02378* (2013.01); *H01L 21/02532* (2013.01); *H10D 8/051* (2025.01); *H10D 8/60* (2025.01); *H10D 62/8325* (2025.01)

(58) Field of Classification Search
CPC ........... H01L 21/7813; H01L 21/02378; H01L 21/0243; H01L 21/02433; H01L 21/02447; H01L 21/02529; H01L 21/02658; H01L 21/3043; H01L 21/304; H01L 2221/68327; H01L 2221/68381; H01L 2221/68386; H01L 21/02647; H10D 8/051; H10D 8/60; H10D 62/8325; H10D 89/011; C30B 25/186; C30B 25/20; C30B 29/36; B01J 27/22
See application file for complete search history.

(56) References Cited

U.S. PATENT DOCUMENTS

| | | |
|---|---|---|
| 6,770,507 B2 | 8/2004 | Abe et al. |
| 7,238,941 B2 | 7/2007 | Tai et al. |
| 7,790,226 B2 | 9/2010 | Tai et al. |
| 9,878,397 B2 | 1/2018 | Hirata et al. |
| 10,084,038 B2 | 9/2018 | Vecino Vazquez et al. |
| 10,304,739 B2 | 5/2019 | Nishibayashi et al. |
| 10,562,130 B1 | 2/2020 | Donofrio et al. |
| 10,576,585 B1 | 3/2020 | Donofrio et al. |
| 10,612,157 B2 | 4/2020 | Kubota et al. |

(Continued)

*Primary Examiner* — Ajay Ojha
*Assistant Examiner* — Sandra Milena Rodriguez Villanu

(57) ABSTRACT

A semiconductor substrate comprising a first epitaxial silicon carbide layer and a second silicon carbide epitaxial layer. At least one semiconductor device is formed in or on the second silicon carbide epitaxial layer. The semiconductor substrate is formed overlying a silicon carbide substrate having a surface comprising silicon carbide and carbon. An exfoliation process is used to remove the semiconductor substrate from the silicon carbide substrate. The carbon on the surface of the silicon carbide substrate supports separation. A portion of the silicon carbide substrate on the semiconductor substrate is removed after the exfoliation process. The surface of the silicon carbide substrate is prepared for reuse in subsequent formation of semiconductor substrates.

20 Claims, 28 Drawing Sheets

(56) References Cited

U.S. PATENT DOCUMENTS

| | | |
|---|---|---|
| 10,755,946 B2 | 8/2020 | Hirata et al. |
| 10,784,339 B2 | 9/2020 | Vecino Vazquez et al. |
| 10,825,733 B2 | 11/2020 | Bhalla et al. |
| 10,828,726 B2 | 11/2020 | Hirata et al. |
| 10,870,176 B2 | 12/2020 | Hirata |
| 10,872,757 B2 | 12/2020 | Hirata |
| 10,872,758 B2 | 12/2020 | Hirata |
| 10,903,078 B2 | 1/2021 | Schulze et al. |
| 10,978,311 B2 | 4/2021 | Drescher et al. |
| 11,031,483 B2 | 6/2021 | Schulze et al. |
| 11,081,393 B2 | 8/2021 | Beyer et al. |
| 11,211,459 B2 | 12/2021 | Brockmeier et al. |
| 2003/0056718 A1 | 3/2003 | Kawahara et al. |
| 2014/0087541 A1* | 3/2014 | Werner ................ H01L 21/304 438/478 |
| 2019/0296125 A1* | 9/2019 | Schulze ............ H01L 21/02433 |
| 2021/0225659 A1 | 7/2021 | Drescher et al. |
| 2021/0225709 A1 | 7/2021 | Rieske et al. |

\* cited by examiner

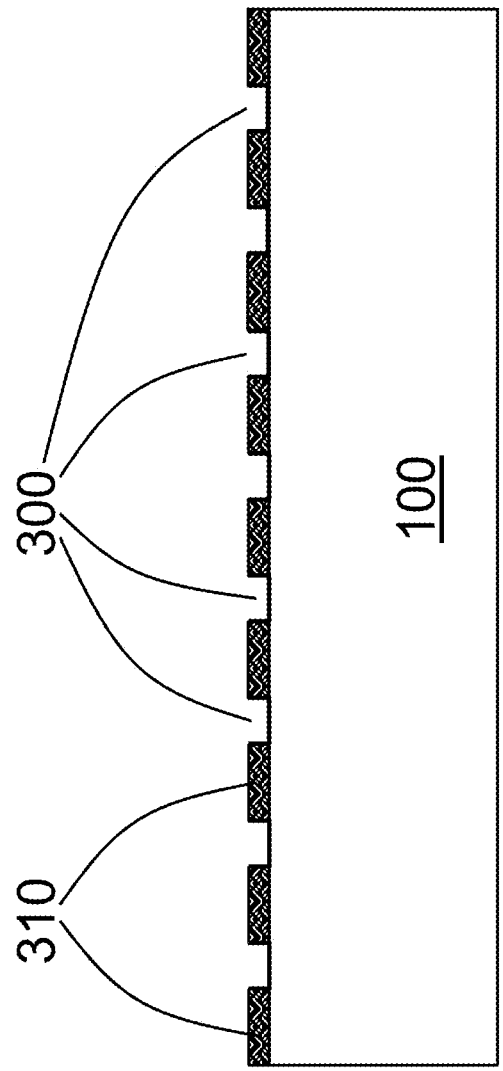

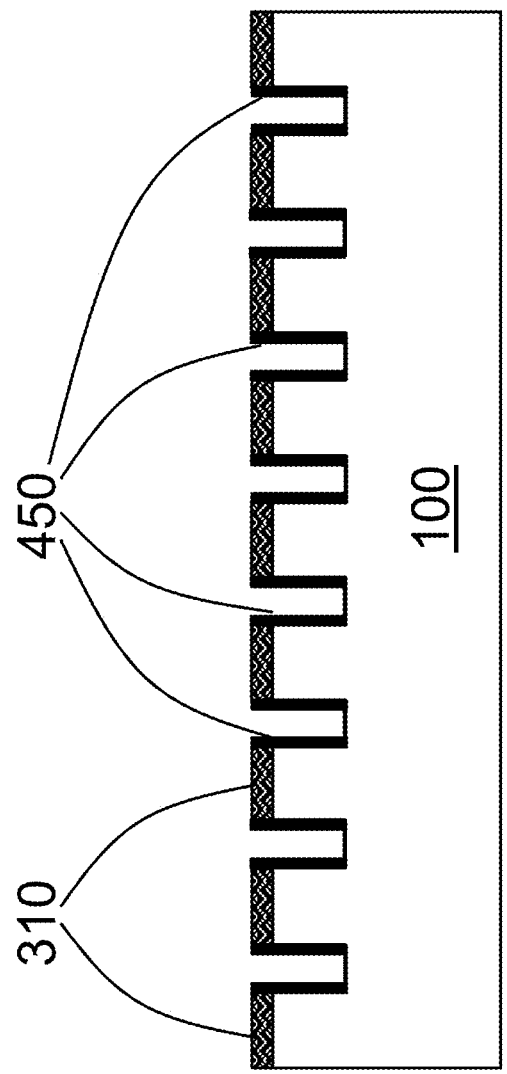

WIDE BAND GAP SEMICONDUCTOR PROCESS, DEVICE, AND METHOD

FIELD

This invention relates to semiconductor device manufacture and, in particular to methods of manufacture wide bandgap semiconductors.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) has now been increasingly used for high voltage drivers (>1200V) whereas Gallium Nitride (GaN) has been experiencing increased use in both higher power and higher frequency applications. However, unlike silicon, the cost of a final device for WBG semiconductor devices is dominated by the cost of the materials. The materials include the substrate and the active layer grown by Epitaxy. The substrate by itself contributes to over half of the cost of a finished WBG semiconductor device.

From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate is paramount while also maintaining low defect densities in the active epitaxial layer.

Accordingly, it is desirable to provide methods to manufacture WBG semiconductors that overcome the thin substrate limitation and reduce the contribution of the substrate to the final die with minimal effect to the yield or performance parameters of the final WBG semiconductor.

BRIEF DESCRIPTION OF THE DRAWINGS

Various features of the system are set forth with particularity in the appended claims. The embodiments herein, can be understood by reference to the following description, taken in conjunction with the accompanying drawings, in which:

FIG. 3A illustrates a patterned hard mask in accordance with an example embodiment;

FIG. 4B illustrates an array of spacers in sidewalls of trenches etched in silicon carbide substrate in accordance with an example embodiment;

DETAILED DESCRIPTION

Figure 1:
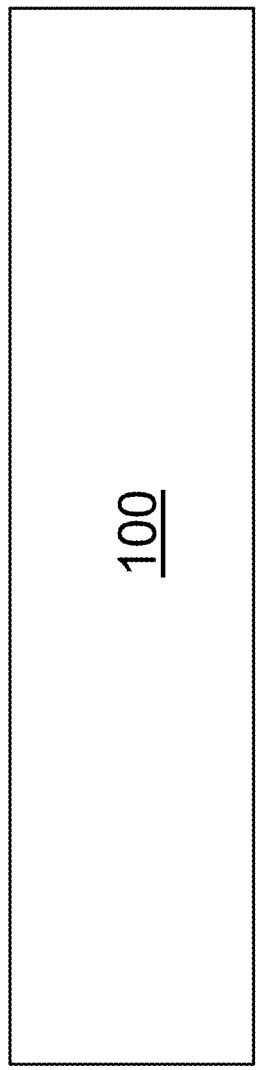
FIG. 1 illustrates a silicon carbide (SiC) single crystal substrate in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment of the fabrication of a Schottky Barrier Diode (SBD) using a silicon carbide wafer as the starting substrate. Alternatively, other devices such as transistors, passive devices, or power transistors can be formed using the described process flow. While silicon carbide substrate is used in the example embodiment, the invention can be implemented in other semiconductor substrates such as gallium nitride, gallium arsenide, indium phosphide, silicon, silicon on insulator (SOI) among others. In addition, the invention may be used in other semiconductor devices such as photonic devices, lasers, light emitting diodes, RF devices, among others.

FIG. 1 is an illustration of a silicon carbide substrate 100 in accordance with an example embodiment. Silicon carbide substrate 100 is used as a starting material for the fabrication of the Schottky Barrier Diode. In one embodiment, silicon carbide substrate 100 is a crystalline 4H silicon carbide wafer with a preferred crystalline orientation of <0001> with an offcut towards <1120> of 4 degrees. In one embodiment, a thickness of silicon carbide substrate 100 is in the range of 300-400 microns. In one embodiment, silicon carbide substrate 100 may be a single polished or double polished wafer and can be considered as the parent wafer, for considerations that is described in subsequent process steps in the implementation of the current invention. In one embodiment, silicon carbide substrate 100 is the basic platform on which the example embodiment is implemented to support the process flow in accordance with the current invention.

Figure 2:
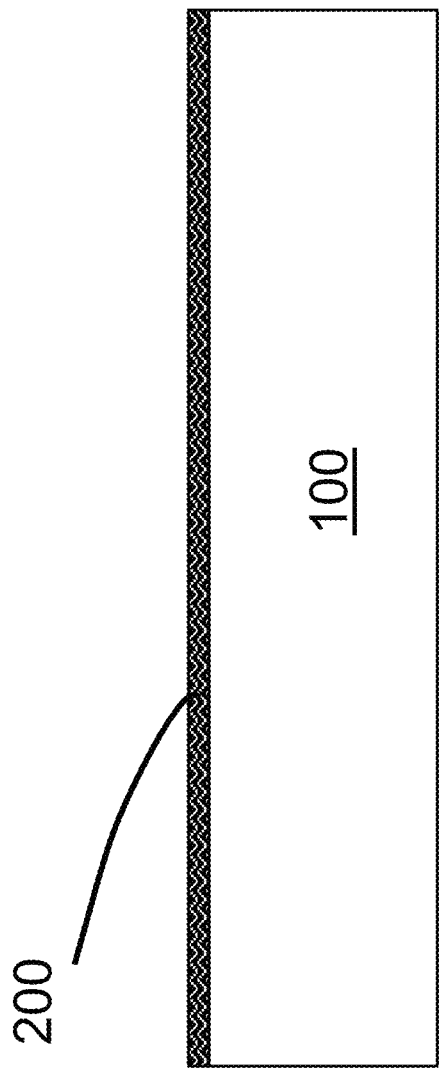
FIG. 2 illustrates a hard mask over the silicon carbide substrate in accordance with an example embodiment.

FIG. 2 is an illustration of a hard mask layer 200 on silicon carbide substrate 100 in accordance with an example embodiment. Hard mask layer 200 is deposited over the surface of substrate 100. Hard mask layer 200 is deposited using techniques such as CVD (Chemical Vapor Deposition), LPCVD (low pressure chemical vapor deposition), PECVD (Plasma Enhanced Chemical Vapor Deposition), APCVD (Atmospheric Pressure Chemical Vapor Deposition), SACVD (Sub Atmospheric Chemical Vapor Deposition) among other techniques. PVD (Physical Vapor Deposition), or ALD (Atomic layer Deposition). In the example implementation, hard mask layer 200 is composed of LPCVD Silicon Nitride. The thickness of silicon nitride hard mask layer 200 is selected based on the requirements of subsequent processing steps as described in the example implementation and is in the range of 100-300 nm. An example of a PVD layer used as the hard mask is $Al_2O_3$ (aluminum oxide). The thickness of hard mask layer 200 is determined by the specific requirements of the implementation and is well known to those skilled in the art and is the range of 100-300 nm.

FIG. 3A is an illustration of a plurality of openings 300 formed in hard mask layer 200 of FIG. 2 in accordance with an example embodiment. In one embodiment, the process steps disclosed herein below will lead to the formation of a device in substrate 100 and more specifically a Schottky Barrier Diode. Hard mask layer 200 of FIG. 2 deposited over the surface of substrate 100 is patterned to subsequently support the formation of plurality of openings 300 to expose surfaces in the plurality of openings 300 of the underlying silicon carbide substrate 100. Plurality of openings 300 are formed in hard mask layer 200 by using methods of lithography and etching used in the semiconductor industry. Patterned hardmask 310 is left in areas to protect substrate 100 from being etched. The shape of plurality of openings 300 are determined by the requirements of epitaxial growth in subsequent steps in the implementation of the example embodiment. In one embodiment, plurality of openings 300 may be in the shape of squares or rectangles. In another embodiment, plurality of openings 300 may be in the shape of triangles, hexagons or diamonds. In another embodiment, plurality of openings 300 may be in the shape of stripes which may be horizontal, vertical, or sloped at an angle. The size of plurality of openings 300 may be in the range of (20-500) nm and determined by the requirements of epitaxial overgrowth in the subsequent steps of fabrication of the example device. In one embodiment, spacing between adjacent openings of plurality of openings 300 is determined by the requirements of epitaxial overgrowth in the subsequent steps of fabrication of the example device and can be in the range of 500 nanometers to 5 micrometers. Plurality of openings 300 are generated on a surface of hard mask layer 200 of FIG. 2 by using lithography techniques that are well known to those skilled in the art. In one embodiment, plurality of openings 300 are implemented using optical lithography using UV, DUV or EUV. In another embodiment, plurality of openings 300 are implemented using an electron beam direct write technique. In yet another embodiment, plurality of openings 300 are implemented using Nano-Imprint Lithography (NIL).

In one example embodiment, plurality of openings 300 are implemented by first coating a surface of hard mask layer 200 with a photosensitive layer of photoresist, which may be positive or negative in its chemistry. In the example embodiment, positive photoresist is used in coating the surface of hard mask layer 200. An optical tool called a stepper is used to transfer the pattern of openings on to the positive photoresist layer using chemistries that are well known to those skilled in the art. The choice of the photoresist layer, thickness of the photoresist layer, the exposure and develop times for the subsequent chemical steps are well known to those skilled in the art and determined by the requirements of accurate pattern transfer from the photoresist layer to hard mask layer 200 to subsequently form plurality of openings 300. The stepper transfers the pattern of plurality of openings 300 to cover the surface of hard mask layer 200 over silicon carbide substrate 100.

After the pattern transfer is completed using lithography, the next step is the patterning of hard mask layer 200 using etching techniques to selectively remove the hard mask layer 200 of FIG. 2 over silicon carbide substrate 100 leaving patterned hardmask 310 on substrate 100. The selective removal of hard mask layer 200 to form patterned hardmask 310 may use Reactive Ion Etching (RIE). Different gases may be used to form a plasma to selectively remove the portions of hard mask layer 200 exposed by the patterned photoresist. The choice of gases for the RIE is determined by hard mask layer 200 used in the implementation. In the example embodiment, with a silicon nitride used as hard mask layer 200, fluorine-based chemistries such as $SF_6$, $CF_4$, $CHF_3$, and other gases may be used in the RIE. Accordingly, in the example embodiment with silicon nitride as hard mask layer 200, plurality of openings 300 are etched in hard mask layer 200 using a fluorine-based chemistry that exposes a surface of silicon carbide substrate 100 in plurality of openings 300. Patterned hardmask 310 remains in areas overlying the surface of substrate 100 to protect or mask the surface of substrate 100 from etching.

Figure 3B:
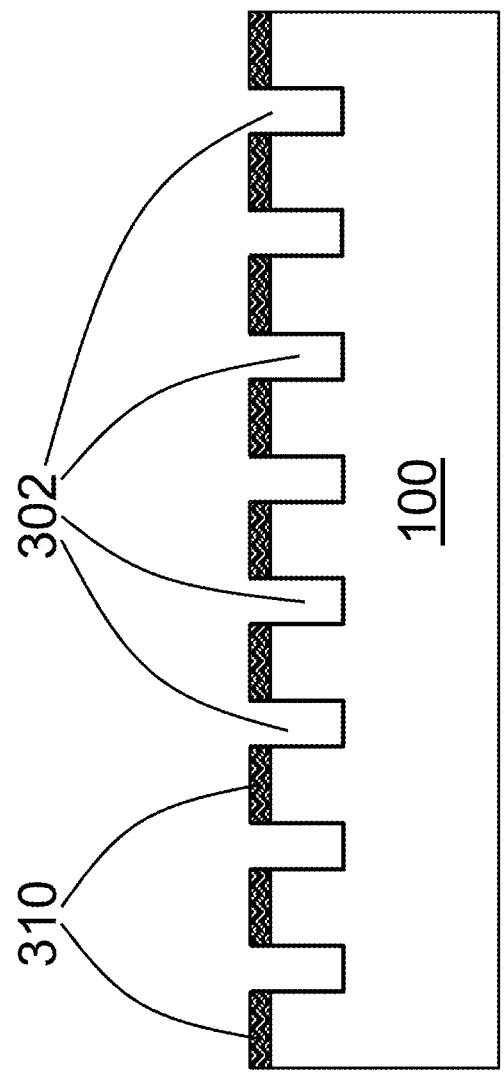
FIG. 3B illustrates a patterned hard mask and array of trenches etched in silicon carbide substrate in accordance with an example embodiment.

FIG. 3B is an illustration of an example embodiment where a plurality of trenches 302 is formed in silicon carbide substrate 100 after hard mask layer 200 is etched in plurality of openings 300 from FIG. 3A. The exposed surface of silicon carbide substrate 100 in plurality of openings 300 is then etched to form plurality of trenches 302 in FIG. 3B using RIE (Reactive Ion Etching). In one embodiment, silicon carbide substrate 100 is etched using patterned hardmask 310 to form plurality of openings 300 into trenches with an aspect ratio that is determined by the requirements of epitaxial growth in subsequent processing of the example device. Thus, plurality of openings 300 are etched below the surface of silicon carbide substrate 100 to form plurality of trenches 302. The depth of plurality of trenches 302 may be in the range of 500 nanometers to 3 micrometers. An inductively coupled plasma (ICP) with high density may also be used to form plurality of trenches 302 in patterned hardmask 310 and silicon carbide substrate 100. After plurality of trenches 302 are formed by etching the exposed surfaces of plurality of openings 300 in silicon carbide substrate 100, the photoresist is removed using resist stripping techniques well known to those well skilled in the art. Silicon carbide substrate 100 is then cleaned in preparation for the next step in the fabrication of the example device. In one embodiment, the pattern of plurality of trenches 302 are shaped as triangles or hexagons to expose (1120) or equivalent crystal planes since these orientations facilitate high quality epitaxial overgrowth with low defect density in subsequent processing steps in accordance with the current invention.

Figure 4A:
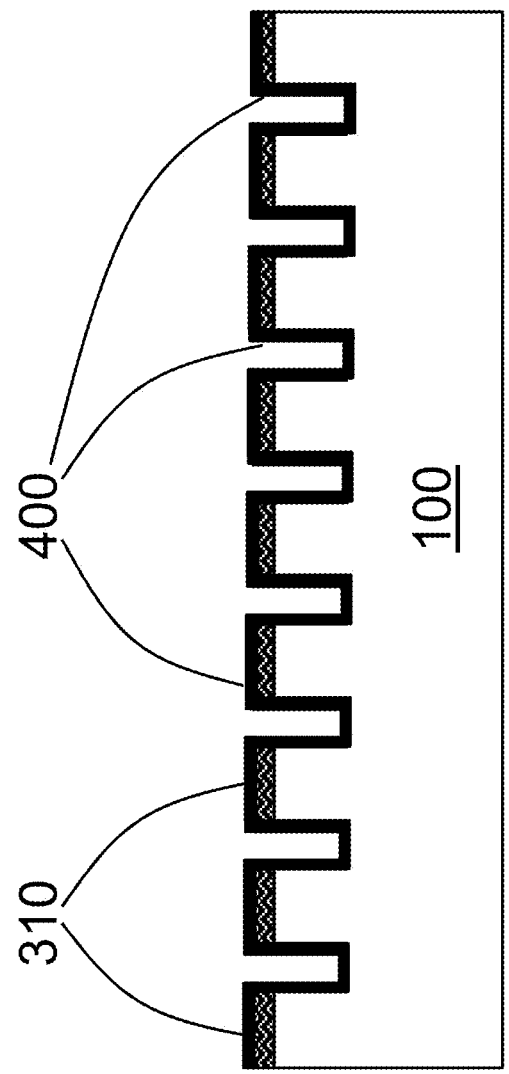
FIG. 4A illustrates a conformal layer deposited over patterned hard mask and array of trenches etched in silicon carbide substrate in accordance with an example embodiment.

FIG. 4A is an illustration of a conformal layer 400 formed overlying silicon carbide substrate 100 in accordance with an example embodiment. In one embodiment, after silicon carbide substrate 100 and patterned hard mask 310 of silicon nitride is etched to form plurality of trenches 302, a conformal layer 400 is deposited over silicon carbide substrate 100. In one embodiment, conformal layer 400 is configured to form on all surfaces including sidewalls of plurality of trenches 302.

FIG. 4B is an illustration of plurality of spacers 402 in accordance with an example embodiment. Conformal layer 400 is removed from top of portions of hard mask 310 in addition to removing conformal layer 400 from a bottom surface of plurality of trenches 302. Plurality of spacers 402 are formed from the deposition of conformal layer 400 that is deposited conformally over the top surface of patterned hard mask layer 310, on plurality of trenches 302, and silicon carbide substrate 100. The material used in plurality of spacers 402 may be deposited using materials such as LPCVD (Low Pressure Chemical Vapor Deposition) silicon nitride, LPCVD LTO (Low Pressure Chemical Vapor Deposition Low Temperature Oxide), LPCVD HTO (Low Pressure Chemical Vapor Deposition High Temperature Oxide), LPCVD TEOS (Low Pressure Chemical Vapor Deposition Tetra Ethyl Ortho Silicate) among other materials. The thickness of the material used for plurality of spacers 402 is determined by the requirements of subsequent processing steps in the fabrication of the example device in accordance with the current invention. In one embodiment, the material used for plurality of spacers 402 is LPCVD silicon nitride with a thickness range of 50-500 nm.

Plurality of spacers 402 are formed by the directional removal of the conformal layer using RIE (Reactive Ion Etching), ion milling and other directional methods. In the example embodiment as shown in FIG. 4B, plurality of spacers 402 formed by LPCVD silicon nitride are formed by RIE using fluorine-based chemistries such as $CF_4$, $CHF_3$, $SF_6$ and other gases. In the example embodiment, plurality of spacers 402 are formed of silicon nitride and hard mask 200 of FIG. 2 is also formed of silicon nitride. It will be appreciated by those skilled in the art that the thicknesses of the two silicon nitride layers are chosen to form plurality of spacers 402 of silicon nitride on the sidewalls of plurality of trenches 302 while also leaving a thickness of portions of patterned hard mask 310 of silicon nitride on the top surface of silicon carbide substrate 100 at this particular step of implementation of an example embodiment. The bottom surfaces of plurality of trenches 302 are exposed portions of underlying silicon carbide substrate 100 where the conformal silicon nitride layer used for spacers 400 have been removed by the directional etch.

Figure 5:
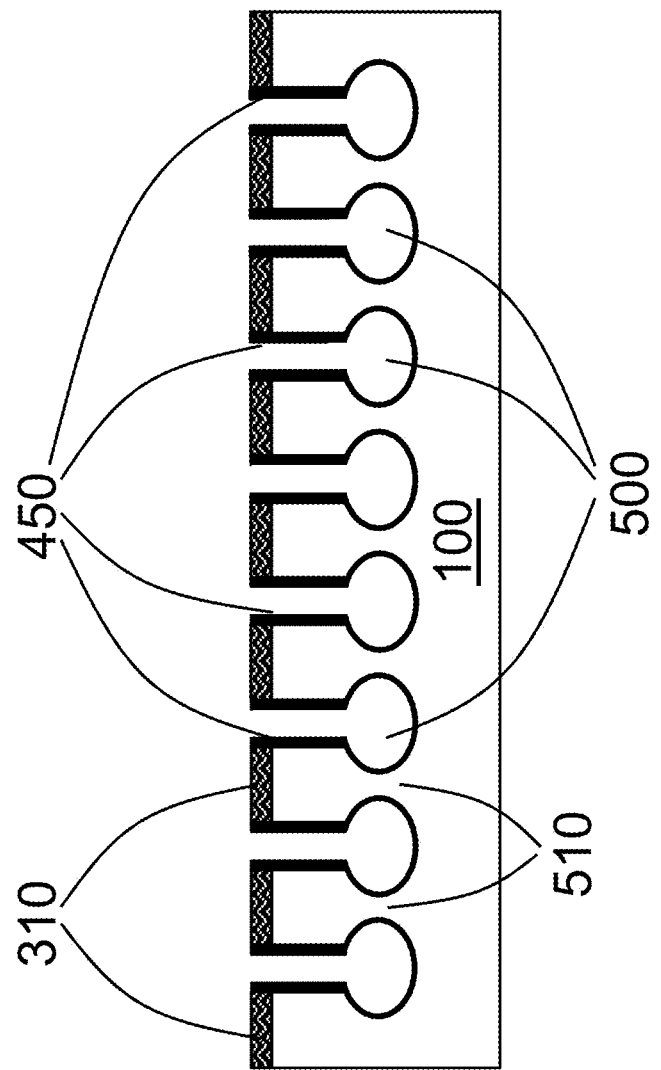
FIG. 5 illustrates an array of micro-voids formed in silicon carbide substrate in accordance with an example embodiment.

FIG. 5 is an illustration of a plurality of micro-voids 500 formed in accordance with an example embodiment. The exposed portions of silicon carbide in substrate 100 below plurality of spacers 402 are isotropically etched using a fluorine chemistry to form plurality of micro-voids 500. In one embodiment, plurality of micro-voids 500 are bottle shaped with a neck region and an underlying wider region. The portions of silicon carbide substrate 100 between plurality of micro-voids 500 forms a plurality of pillars 510 that provide mechanical adhesion to silicon carbide substrate 100 to portions of the device formed in subsequent fabrication steps. In one embodiment, an ICP (Inductively Coupled Plasma) is used for isotropic etching of plurality of micro-voids 500 below plurality of spacers 402. In another embodiment, a heated chuck is used in the RIE (Reactive Ion Etching) during isotropic etch forming plurality of micro-voids 500. In another embodiment, an electro-chemical etch of dilute HF (hydrofluoric acid) is used to form plurality of micro-voids 500 below plurality of spacers 400.

Figure 6:
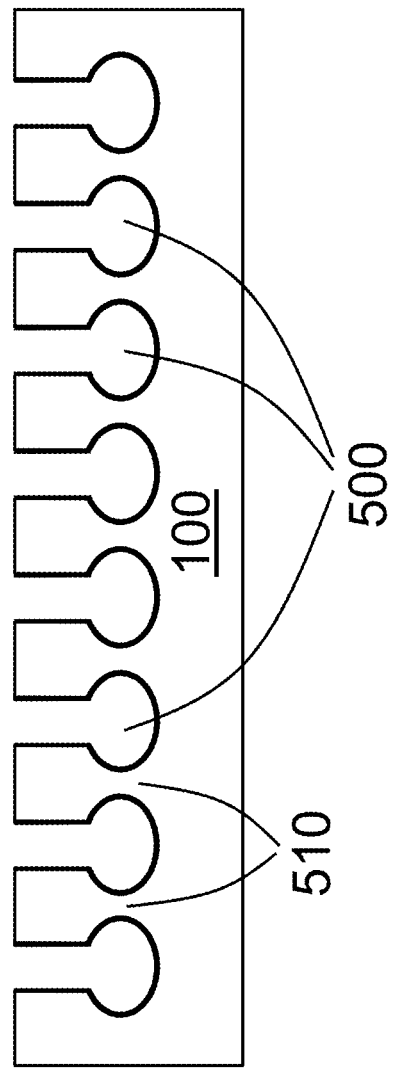
FIG. 6 illustrates the silicon carbide substrate with array of micro-voids after removal of patterned hard mask and spacers in accordance with an example embodiment.

FIG. 6 is an illustration showing plurality of pillars 510 and plurality of micro-voids 500 after removal of patterned hard mask 310 of FIG. 5 and plurality of spacers 402 of FIG. 5 in accordance with an example embodiment. Wet etching chemistries are used to remove patterned hard mask 310 and plurality of spacers 402, depending on the materials used for patterned hard mask 310 and plurality of spacers 402. In the example embodiment, silicon nitride is used for patterned hard mask 310 of FIG. 3 and plurality of spacers 402 of FIG. 5 and hot phosphoric acid is used to remove the silicon nitride layers.

Figure 7:
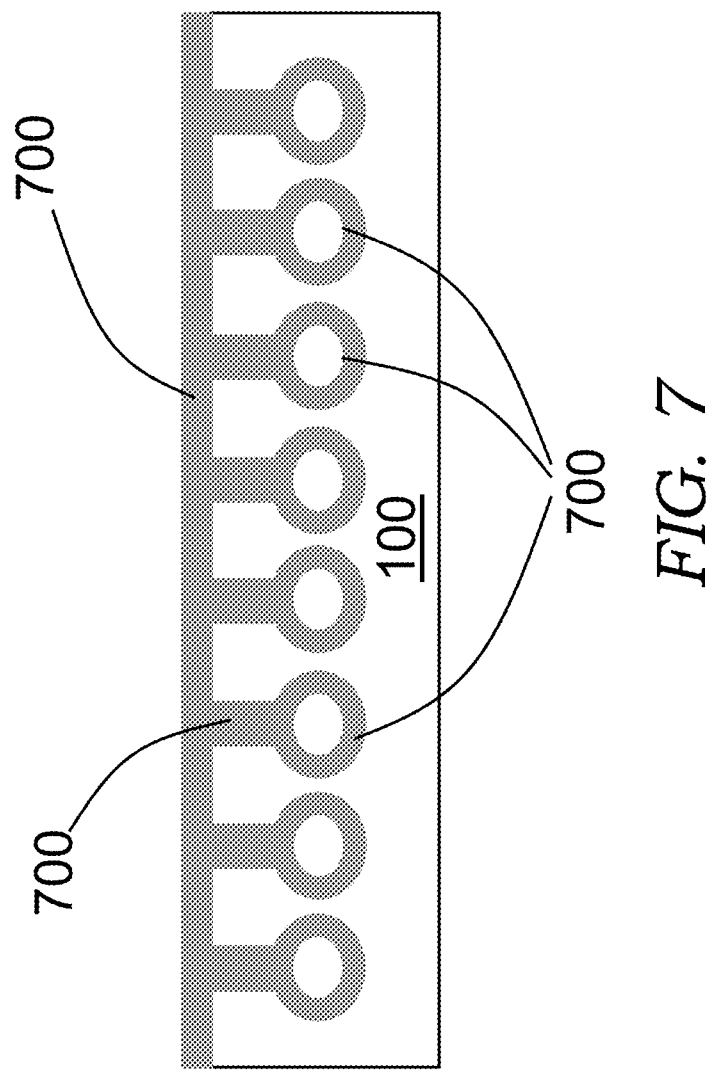
FIG. 7 illustrates a conformal polymer layer in array of micro-voids in silicon carbide substrate in accordance with an example embodiment.

FIG. 7 is an illustration of plurality of micro-voids 500 filled with a polymer layer 700 in accordance with an example embodiment. Polymer layer 700 enables silicon carbide substrate 100 with plurality of micro-voids 500 and plurality of pillars 510 from FIG. 5 to be mechanically strong to withstand mechanical and thermal stresses during subsequent processing steps in the example embodiment while also being able to be separated from the device structure subsequently formed by methods of exfoliation which is described later. In the example embodiment, plurality of micro-voids 500 from FIG. 5 are filled either completely or partially with polymer layer 700. In one embodiment, polymer layer 700 is composed of Parylene. Parylene (trade name for poly p-xylylene) is a semicrystalline thermoplastic polymer deposited using CVD (Chemical Vapor Deposition). Parylene C is one version of parylene which is a chlorinated poly para-xylylene polymer and is deposited using CVD (Chemical Vapor Deposition) to form a conformal coating. Parylene C deposition consists of heating a solid, granular material called dimer under vacuum to vaporize into a dimeric gas at temperature of (100-150)° C. The dimeric gas is then pyrolyzed to cleave the dimer into its monomeric form. The monomer gas is then used in a vacuum chamber at room temperature to deposit conformally in all surfaces of the samples inside the vacuum chamber as a thin transparent polymer film. In one embodiment, silicon carbide substrate 100 with plurality of micro-voids 500 from FIG. 5 is coated with polymer layer 700 of Parylene C conformally. The thickness of Parylene C is chosen to completely seal the neck region of plurality of micro-voids 500 from FIG. 5 and also deposit on surface of silicon carbide substrate 100 and is in the range of 500 nm to several micrometers.

Figure 8:
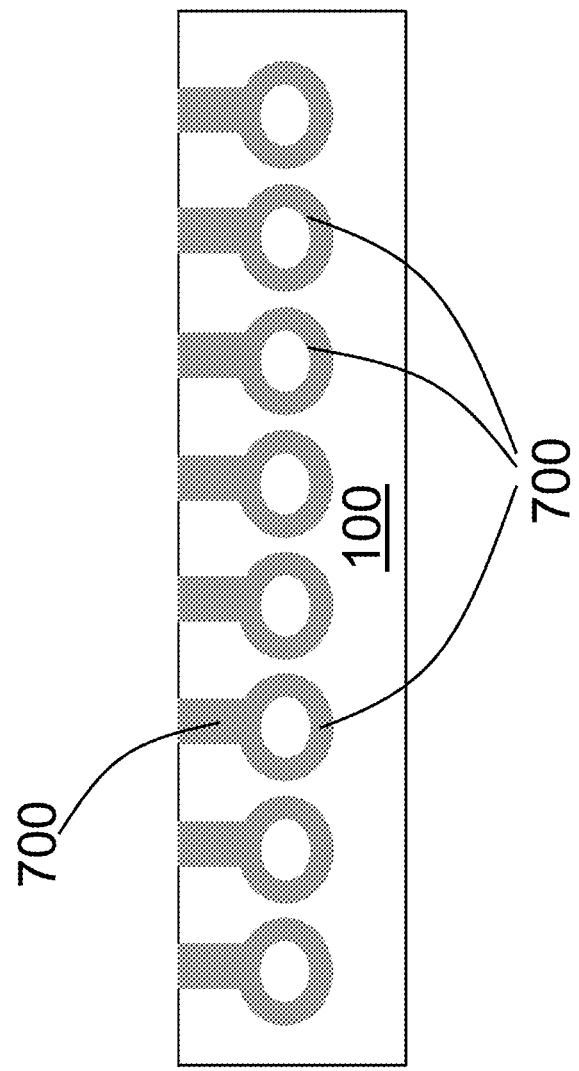
FIG. 8 illustrates the conformal polymer etched back in silicon carbide substrate in array of micro-voids in accordance with an example embodiment.

FIG. 8 is an illustration with silicon carbide substrate 100 with plurality of micro-voids 500 from FIG. 5 filled with polymer layer 700 etched back from the surface of silicon carbide substrate 100 in accordance with an example embodiment. In the example embodiment, Parylene C used in polymer layer 700 is etched from surface of silicon carbide substrate 100 using oxygen plasma while neck regions of plurality of micro-voids 500 are sealed with the residual thickness of conformal Parylene C.

Figure 9:
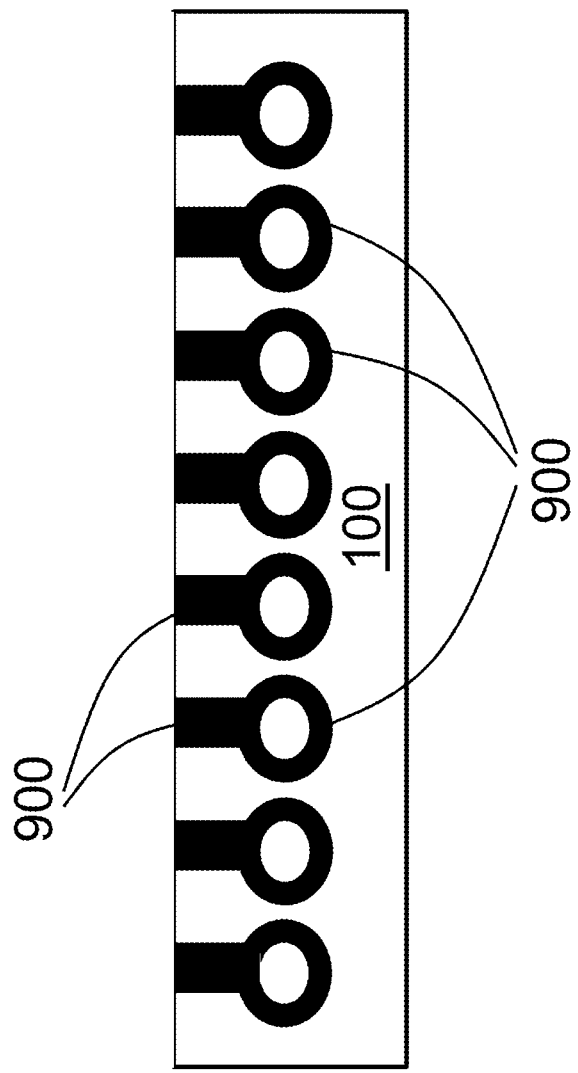
FIG. 9 illustrates pyrolyzed layer of polymer in array of micro-voids in silicon carbide substrate in accordance with an example embodiment.

FIG. 9 is an illustration where polymer layer 700 from FIG. 8 is converted into a carbonized layer 900 in accordance with an example embodiment. Carbonized layer 900 is formed by pyrolysis of polymer layer 700 from FIG. 8 in an inert environment. The pyrolysis of polymer layer 700 from FIG. 8 converts it into a carbon layer which may be amorphous or polycrystalline. In one embodiment, the temperature for pyrolysis is between (600-1200)° C. and the inert environment is nitrogen, forming gas (nitrogen and hydrogen) among others. Carbonized layer 900 in FIG. 9 is not drawn to scale due to the shrinkage of polymer layer 700 during the pyrolysis process. In another embodiment, polymer layer 700 is first pyrolyzed to carbon and then etched back using oxygen plasma to remove portion of carbonized layer 900 from the surface of silicon carbide substrate 100, while also accounting for the shrinkage of the CVD deposited Parylene C layer during pyrolysis. In one embodiment, multiple layers of polymer layer 700 are deposited and converted to carbonized layer 900 to account for the shrinkage of polymer layer 700 during pyrolysis.

Figure 10:
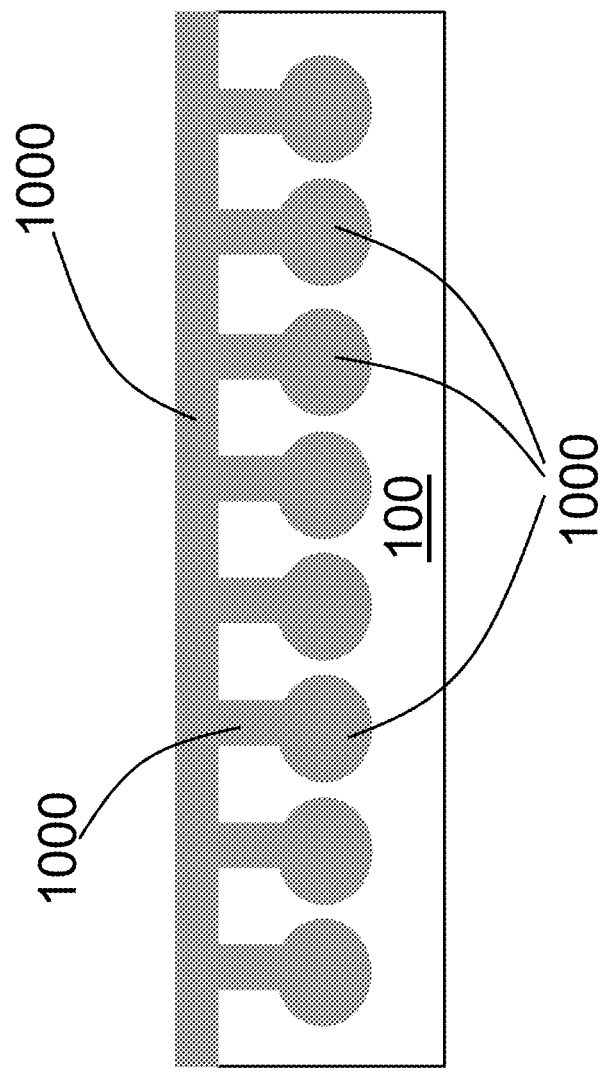
FIG. 10 illustrates an alternate embodiment with array of micro-voids in silicon carbide substrate completely filled with polymer layer.

FIG. 10 is an illustration of plurality of micro-voids 500 from FIG. 5 completely filled with polymer photoresist 1000 in accordance with an example alternate embodiment. polymer photoresist 1000 may be of positive or negative polarity. Polymer photoresist 1000 is spin coated on top the surface of silicon carbide substrate 100 to completely fill plurality of micro-voids 500 from FIG. 5. Polymer photoresist 1000 may be spray coated to fill plurality of micro-voids from FIG. 5 with polymer photoresist 1000 while forming a layer on the surface of silicon carbide substrate 100. In one embodiment, after the deposition of polymer photoresist 1000, it is soft baked to drive out solvents. Soft baking polymer photoresist 1000 means that it is heated to a temperature in the range of 90-100° C. in an inert environment such as nitrogen to drive out solvents. Multiple layers of polymer photoresist 1000 may be used to completely fill plurality of micro-voids 500.

Figure 11:
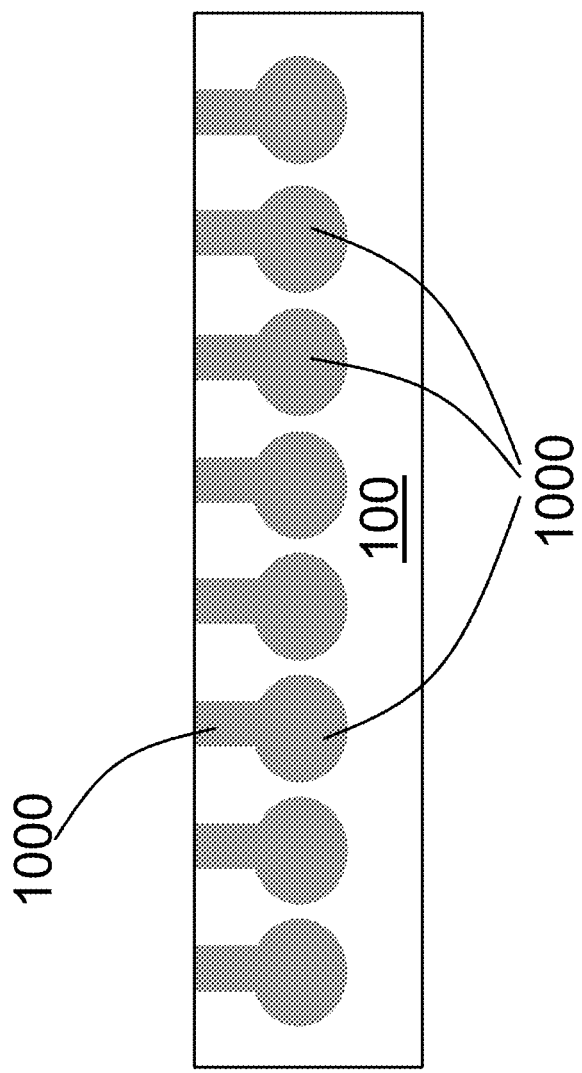
FIG. 11 illustrates an alternate embodiment with polymer layer etched back in surface of silicon carbide substrate and completely filling array of micro-voids.

FIG. 11 is an illustration of plurality of micro-voids 500 from FIG. 5 filled with polymer photoresist 1000 that is RIE (Reactive Ion Etching) etched using oxygen plasma to remove portions of polymer photoresist 1000 from the surface of silicon carbide substrate 100 in accordance with an example alternate embodiment.

Figure 12:
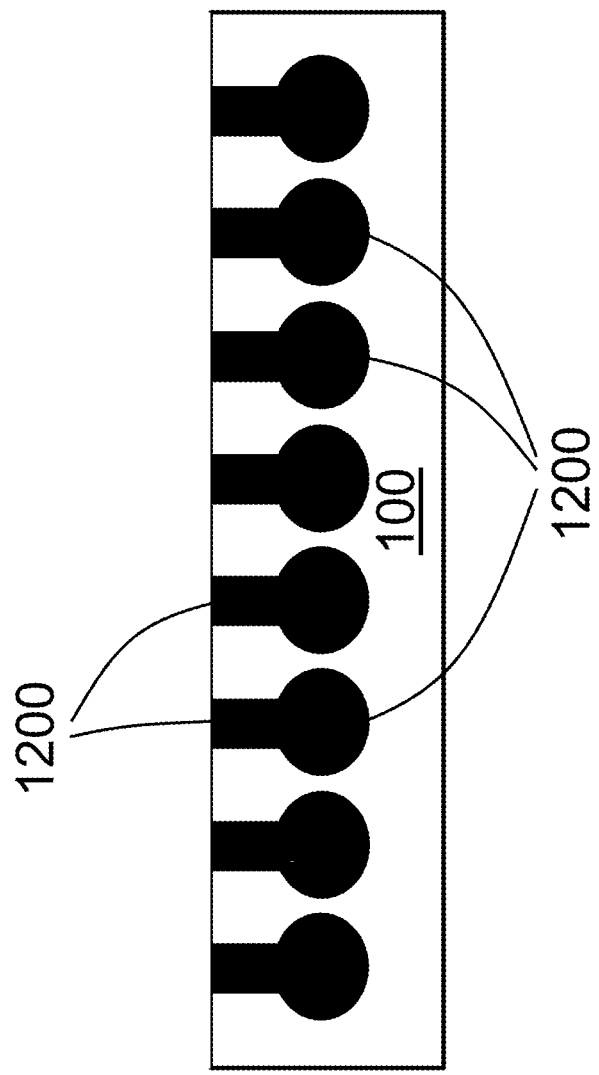
FIG. 12 illustrates an alternate embodiment with pyrolyzed polymer completely filling array of micro-voids in silicon carbide substrate.

FIG. 12 is an illustration of plurality of micro-voids 500 from FIG. 5 filled with polymer photoresist 1000 from FIG. 11 converted to a carbonized layer 1200 by process of pyrolysis in accordance with an example alternative embodiment. Pyrolysis of polymer photoresist 1000 from FIG. 11 consists of thermal treatment in an inert environment to form carbonized layer 1200. Pyrolysis of polymer photoresist layer 1000 from FIG. 11 into carbonized layer 1200 can consist of multiple intermediate thermal treatments. In one embodiment, polymer photoresist 1000 from FIG. 11 is baked in nitrogen environment at 90° C. (typically called a soft bake), followed by bake at 115° C. (typically called a hard bake) in nitrogen environment. Hard baked polymer photoresist 1000 from FIG. 11 is then cured at 450° C. in nitrogen environment and then pyrolyzed in a furnace in nitrogen at (800-1200) ° C. to convert polymer photoresist 1000 from FIG. 11 to carbonized layer 1200. In another embodiment, forming gas (nitrogen and hydrogen) is used for the pyrolysis of polymer photoresist 1000 from FIG. 11 to carbonized layer 1200.

Figure 13:
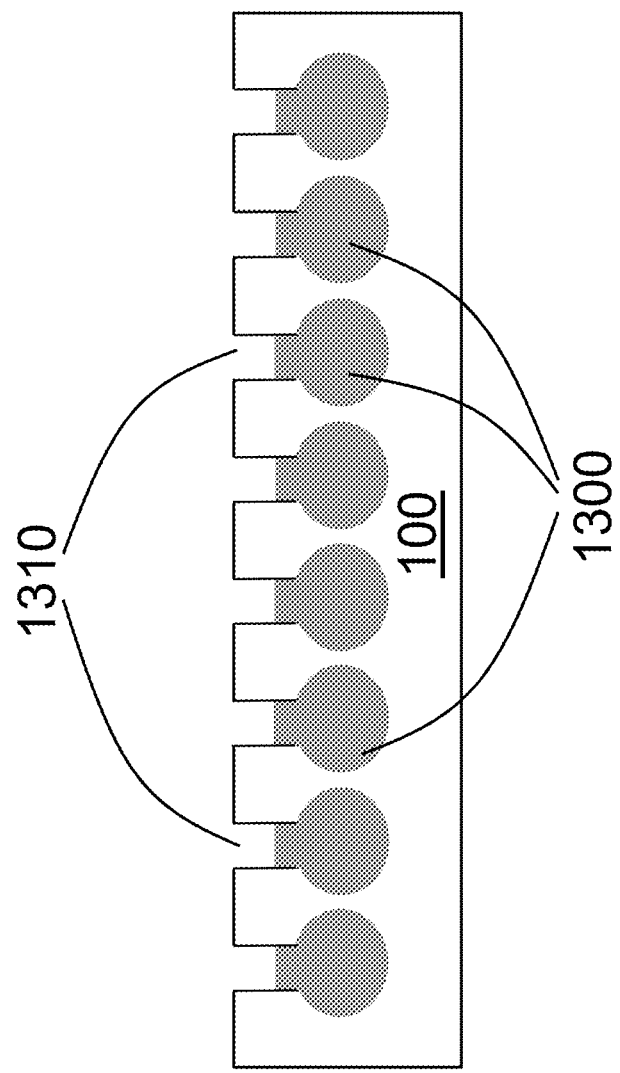
FIG. 13 illustrates an alternate embodiment with array of micro-voids in silicon carbide substrate partially filled with polymer layer.

FIG. 13 is an illustration of plurality of micro-voids 500 of FIG. 5 having a plurality of openings 1310 that are partially filled with a photo-sensitive polymer 1300 in accordance with an example embodiment. In one embodiment, photo-sensitive polymer 1300 is dispensed by spin coating to completely cover the surface of silicon carbide substrate 100 including plurality of micro-voids 500 from FIG. 5. Photo-sensitive polymer 1300 may consist of positive photoresist, negative photoresist, photo-definable polyimide among other polymers. In the example embodiment, a positive photoresist is used as photo-sensitive polymer 1300 completely refills plurality of micro-voids 500 of FIG. 5 and also covers the surface of silicon carbide substrate 100. In one embodiment, photo-sensitive polymer 1300 is baked at 90° C. to drive off solvents and exposed to UV (Ultra-Violet) light in a contact aligner or optical stepper to cross-link the photo-sensitive photoresist. In one embodiment, after a post exposure bake of 110° C., the exposed photo-sensitive polymer 1300 is developed in a suitable chemical to remove portions of the exposed photo-sensitive polymer 1300 from the surface of silicon carbide substrate 100 including a portion of a neck region of plurality of micro-voids 500 from FIG. 5 leaving exposed and developed photo-sensitive polymer 1300 partially filling plurality of micro-voids 500 of FIG. 5 and forming plurality of openings 1310

Figure 14:
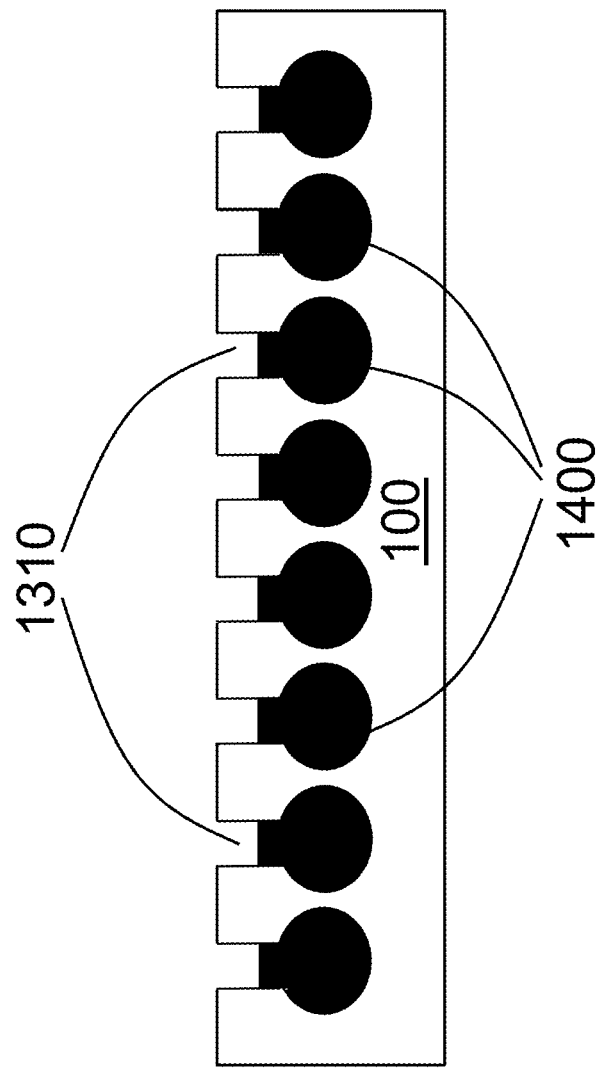
FIG. 14 illustrates an alternate embodiment with pyrolyzed polymer partially filling array of micro-voids in silicon carbide substrate.

FIG. 14 is an illustration of a carbonized layer 1400 in accordance with an example embodiment partially filling plurality of micro-voids 500 from FIG. 5. A carbonized layer 1400 is formed when photo-sensitive polymer 1300 of FIG. 13 is carbonized. Carbonized layer 1400 substantially fills plurality of micro-voids 500 of FIG. 5. Carbonization of photo-sensitive polymer layer 1300 into carbonized layer 1400 is accomplished by thermal treatments that can comprise multiple steps. In one embodiment, photo-sensitive polymer 1300 from FIG. 13 is baked in a nitrogen environment at 90° C., followed by a bake at 115° C. in nitrogen environment. In one embodiment, baked photo-sensitive polymer layer 1300 is then cured at 450° C. in nitrogen environment and then pyrolyzed in a furnace in nitrogen at (800-1200) ° C. to convert photo-sensitive polymer layer 1300 from FIG. 13 by pyrolysis to carbonized layer 1400. In another embodiment, forming gas (nitrogen and hydrogen) is used for the pyrolysis of polymer photoresist 1300 from FIG. 13 to carbonized layer 1400 with plurality of openings 1310 from FIG. 13 in silicon carbide substrate 100.

Figure 15:
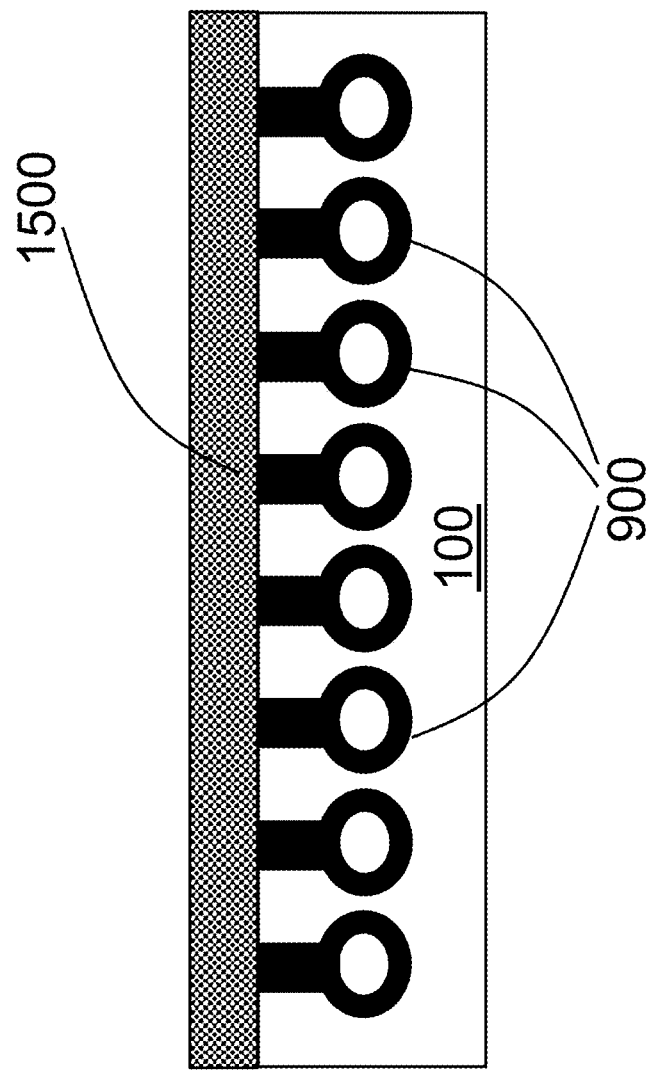
FIG. 15 illustrates an epitaxially grown layer with merged epitaxial lateral overgrowth (MELO) over array of carbon filled micro-voids in silicon carbide substrate in accordance with an example embodiment.

FIG. 15 is an illustration of an epitaxial layer 1500 forming an epitaxial layer formed overlying the surface of silicon carbide substrate in accordance with an example embodiment. In one embodiment, epitaxial layer 1500 is a silicon carbide epitaxial layer formed over plurality of micro-voids 500 from FIG. 5 conformally filled with carbonized layer 900 from FIG. 9. In another embodiment, silicon carbide substrate 100 with plurality of micro-voids 500 from FIG. 5 completely filled with carbonized layer 1200 from FIG. 12 that has been pyrolyzed to support formation of epitaxial layer 1500 over the surface of silicon carbide substrate 100. In another embodiment, plurality of micro-voids 500 from FIG. 5 partially filled with carbonized layer 1400 from FIG. 14 that has been pyrolyzed enables formation of epitaxial layer 1500 over surface of silicon carbide substrate 100 over plurality of openings 1310 from FIG. 14. Epitaxial layer 1500 may be a N+ heavily doped layer forming a buffer epitaxial layer.

In general, epitaxial layer 1500 from FIG. 15 is formed on silicon carbide substrate 100 with plurality of micro-voids 500 from FIG. 5 completely or partially filled with pyrolyzed polymer layer forming the carbonized layer. Epitaxial layer 1500 is formed overlying the surface of silicon carbide substrate 100 in a silicon carbide epitaxial reactor. In the epitaxial reactor, silicon carbide grows with the crystalline structure of exposed silicon carbide substrate 100 vertically as well as laterally with carbonized layer 900 of FIG. 9, carbonized layer 1200 of FIG. 12 or carbonized layer 1400 of FIG. 14 completely or partially filling plurality of micro-voids 500 from FIG. 5 thereby inhibiting the epitaxial growth with growth conditions that are well known who are skilled in the art. The lateral fronts of the epitaxial regions of silicon carbide epitaxial layer 1500 merge due to epitaxial lateral overgrowth (ELO) or merged epitaxial lateral overgrowth (MELO). The process of epitaxial crystal growth is used to form a single crystal layer of silicon carbide over plurality of micro-voids 500 from Figure completely or partially filled the carbonized layer 900 of FIG. 9, carbonized layer 1200 of FIG. 12 or carbonized layer 1400 of FIG. 14. In the example embodiment, epitaxial layer 1500 is an epitaxial layer of silicon carbide. This method of ELO or MELO over the regions of carbon filled plurality of micro-voids 500 from FIG. 5 enables the formation of epitaxial layer 1500 with low defect density which is mechanically supported by plurality of micro-voids 500 from FIG. 5 completely or partially filled carbonized layer 900 of FIG. 9, carbonized layer 1200 of FIG. 12 or carbonized layer 1400 of FIG. 14 along with plurality of pillars 510 from FIG. 5 comprising silicon carbide. Silicon carbide substrate 100 with plurality of micro-voids 500 and plurality of silicon carbide pillars 510 from FIG. 5 below epitaxial layer 1500 forms a plane where epitaxial layer 1500 can be exfoliated from substrate 100 in subsequent process steps. The carbon which completely or partially fills plurality of micro-voids 500 along with plurality of pillars 510 from FIG. 5 enables the formation of epitaxial layer 1500 as a single crystal silicon carbide layer by ELO or MELO. This plane of separation comprises plurality of micro-voids 500 filled completely or partially with carbonized layer 900 of FIG. 9, carbonized layer 1200 of FIG. 12 or carbonized layer 1400 of FIG. 14 and plurality of pillars 510 from FIG. 5. In one embodiment, epitaxial layer 1500 is grown in an epitaxial reactor using CVD (Chemical Vapor Deposition) epitaxial growth processes or by modified bulk crystal growth processes such as high Temperature CVD or by Physical Vapor Transport (PVT).

Carbon layer 900 from FIG. 9 formed by the pyrolysis of polymer which completely or partially fills plurality of micro-voids 500 in FIG. 5 is compatible with the epitaxial growth process since carbon is incorporated in the silicon carbide crystalline structure during the epitaxial growth where gases such as acetylene ($C_2H_2$) is used in the epitaxial reactor along with other process gases such as DCS (Dichlorosilane), TCS (trichlorosilane), silane among other process gases. In an example embodiment, carbon layer 900 from FIG. 9 formed in plurality of micro-voids 500 in FIG. 5 may be amorphous or polycrystalline depending on the method used for depositing and thermal processing of the deposited polymer layer and is capable of withstanding high temperature processing of the silicon carbide devices formed above epitaxial layer 1500 in subsequent process steps. In addition, carbon has a Young's modulus of 70 GPa compared to 700 GPa of singe crystal silicon carbide. By appropriate design of mechanical and thermal considerations of carbon filled or partially filled plurality of micro-voids 500 and plurality of pillars 510 from FIG. 5, the forces required for exfoliation of single crystal silicon carbide epitaxial layer 1500 along with subsequently other layers and devices may be tailored to be optimized such that the entire structure can withstand the thermal and mechanical processes during subsequent device formation steps while also being able to be separated by an exfoliation process in the plane of carbon filled plurality of micro-voids 500 and plurality of pillars 510 of silicon carbide from FIG. 5. In the example embodiment, epitaxial layer 1500 comprises of N+ 4H Silicon Carbide and can be of a thickness of about 5-20 micrometers. In another embodiment, P+ silicon carbide can be used for epitaxial layer 1500. The doping of epitaxial layer 1500 is high enough to provide an ohmic contact for the silicon carbide device formed on epitaxial layer 1500 during subsequent processing steps.

Figure 16:
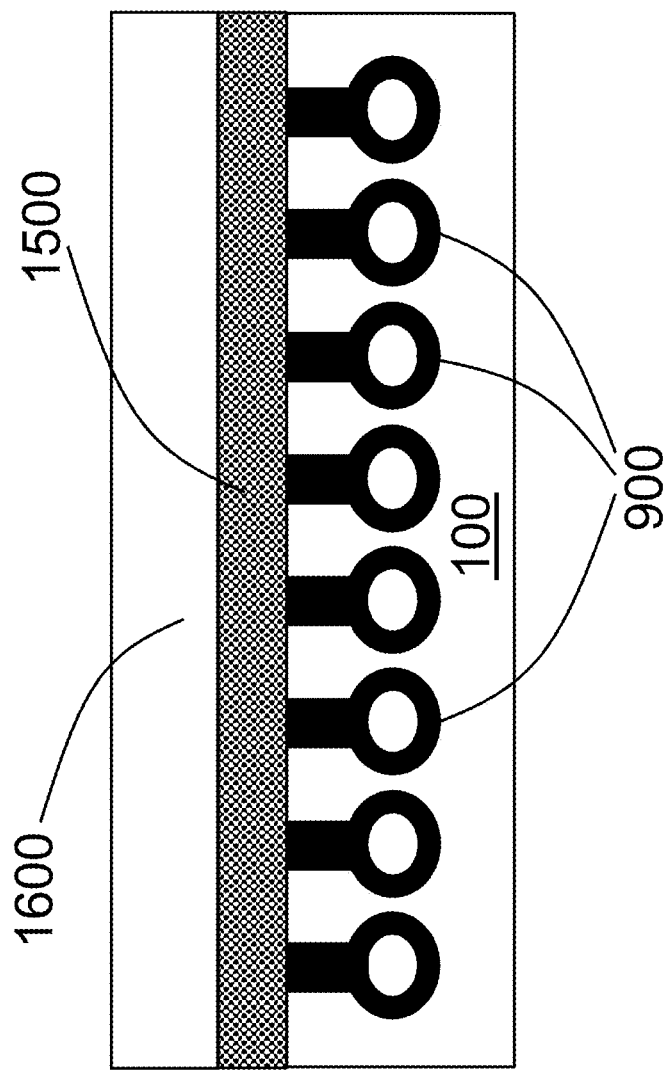
FIG. 16 illustrates an epitaxially grown layer over an epitaxially grown epitaxial layer with merged epitaxial lateral overgrowth (MELO) over array of carbon filled micro-voids in silicon carbide substrate in accordance with an example embodiment.

FIG. 16 is an illustration of an epitaxial layer 1600 formed overlying epitaxial layer 1500 in accordance with an example embodiment. In one embodiment, a device is formed in epitaxial layer 1600 that is grown overlying epitaxial layer 1500 in an epitaxial reactor. In one embodiment, epitaxial layer 1600 comprises silicon carbide. In an example embodiment, the device that is formed in epitaxial layer 1600 is a silicon carbide device that is formed in subsequent processing steps. In one embodiment, prior to the epitaxial growth of epitaxial layer 1600, a surface of epitaxial layer 1500 may be lightly polished using a polishing step called kiss polish to remove any surface defects on the surface of epitaxial layer 1500. In one embodiment, the doping and thickness of device epitaxial layer 1600 are determined by the electrical requirements of devices that are formed in device epitaxial layer 1600. In one embodiment, the thickness of device epitaxial layer 1600 is determined by a breakdown voltage of the device formed in the epitaxial layer 1600 in subsequent processing steps and is typically between 10-30 micrometers. In the example embodiment, epitaxial layer 1600 is doped N- and has a thickness of about 10-12 micrometers for a device breakdown voltage of 1200 Volts. Epitaxial layer 1600 formed overlying epitaxial layer 1500 is used for formation of silicon carbide devices using processes well known to those skilled in the art. In the example embodiment, epitaxial layer 1600 is used for formation of a Schottky Barrier Diode in accordance with the current invention.

In one embodiment, device epitaxial layer 1600 overlying epitaxial layer 1500 enables the formation of silicon carbide devices that can subsequently be separated from silicon carbide substrate 100 by method of exfoliation that may be thermal, mechanical, and other techniques. A combination of techniques may also be used for used for the exfoliation of device epitaxial layer 1600 and epitaxial layer 1500 on which semiconductor devices can be fabricated. It should be also noted that the exfoliation process disclosed herein supports reuse of silicon carbide substrate 100 as epitaxial layer 1500 comprises only a portion of silicon carbide substrate 100. In one embodiment, a surface of silicon carbide substrate 100 can be prepared to be reused to form more devices.

Figure 17:
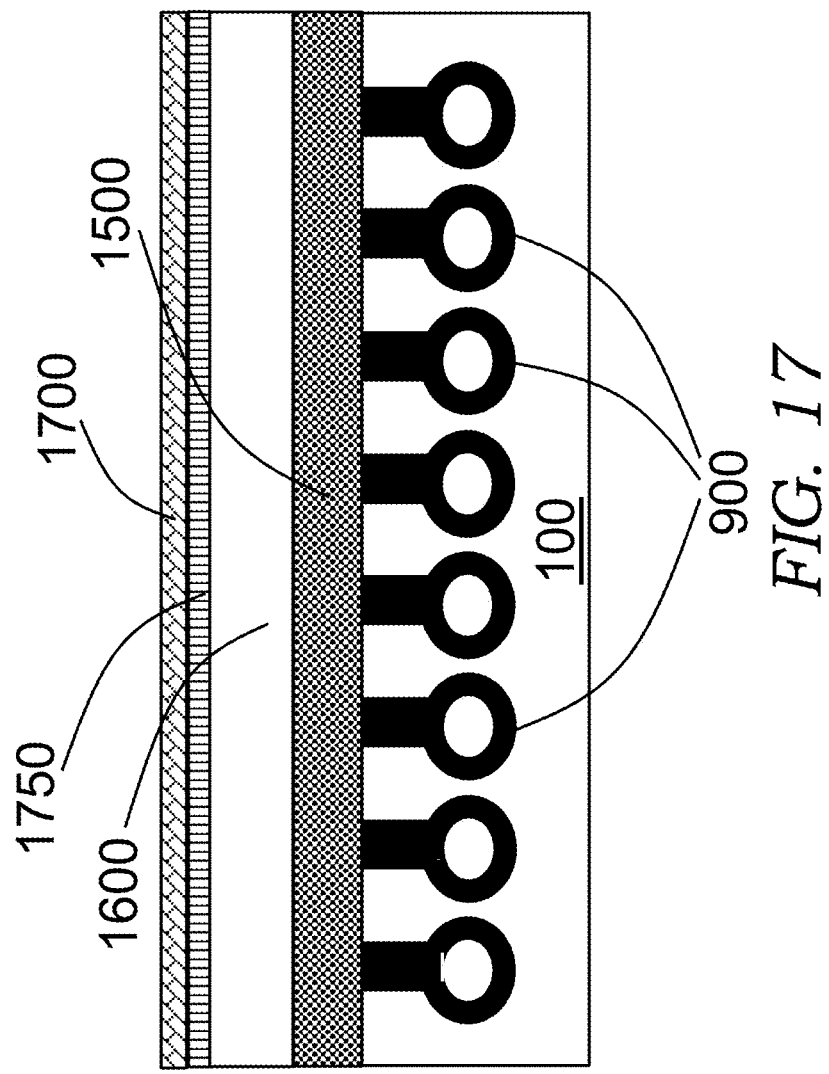
FIG. 17 illustrates a diode contact layer with dielectric isolation layer over an epitaxially grown layer over an epitaxially grown epitaxial layer with merged epitaxial lateral overgrowth (MELO) over array of carbon filled micro-voids in silicon carbide substrate in accordance with an example embodiment.

FIG. 17 is an illustration of epitaxial layer 1600 being doped to lower resistivity in accordance with an example embodiment. To reduce a contact resistance of the device, dopants are implanted on a surface of device epitaxial layer 1600. In one embodiment, a dopant species, dose, energy and other parameters are determined by the design of the Schottky Barrier Diode. In one embodiment, the implanted layer is N+. The implanted dopants are then subsequently annealed to form an ohmic contact region 1750. After formation of ohmic contact region 1750, a dielectric isolation layer 1700 is deposited and then patterned and etched using standard wafer processing steps. Dielectric isolation layer 1700 is deposited by using PECVD Silicon Dioxide, PECVD Silicon Nitride, PECVD, or Silicon Oxynitride among other films. In one embodiment, a thickness of dielectric isolation layer 1700 is in a range of (1-4) micrometers. In the example embodiment, dielectric isolation layer 1700 is PECVD Silicon Oxide and is approximately one micrometer thick.

Figure 18:
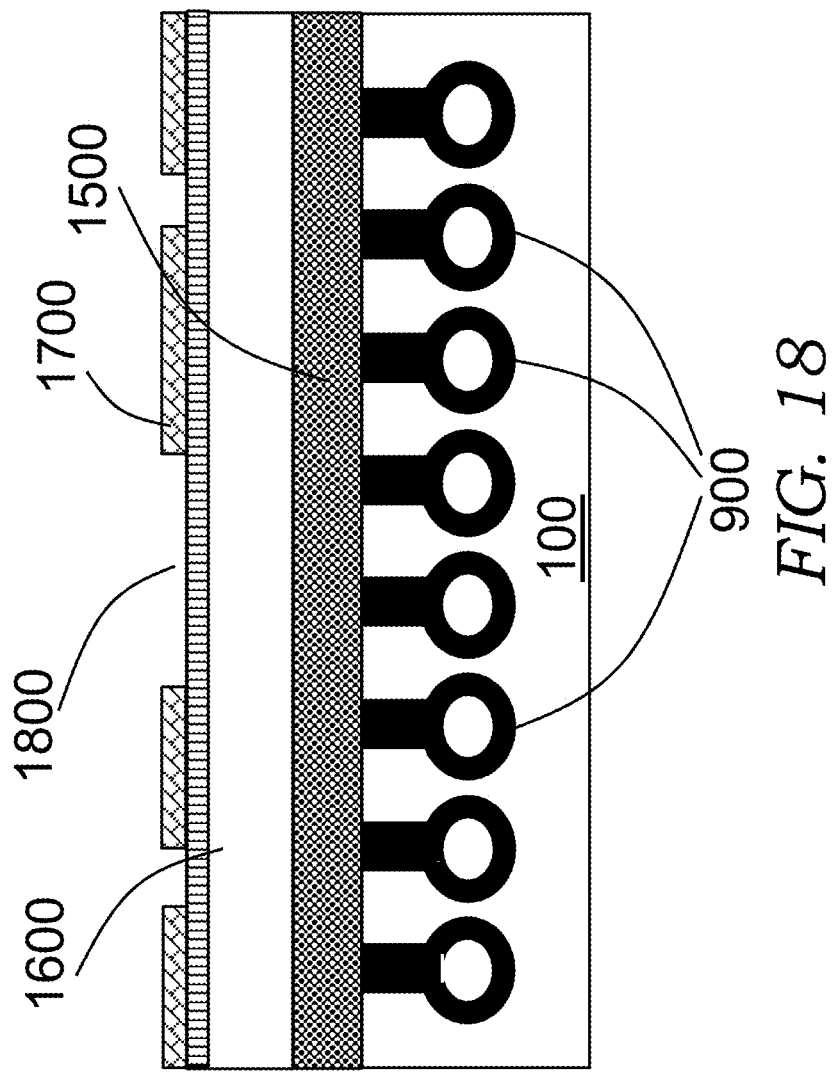
FIG. 18 illustrates patterned dielectric isolation layer over an epitaxially grown layer over an epitaxially grown epitaxial layer with merged epitaxial lateral overgrowth (MELO) over array of carbon filled micro-voids in silicon carbide substrate in accordance with an example embodiment.

FIG. 18 is an illustration of contact openings 1800 formed in the dielectric isolation layer 1700 in accordance with an example embodiment. In one embodiment, dielectric isolation layer 1700 is patterned and etched to form contact openings 1800. In one embodiment, patterning is done using photolithography techniques and etching of dielectric isolation layer 1700 to form contact openings 1800 is done using RIE (Reactive Ion Etching), wet etching or a combination of etching steps. In the example embodiment, contact openings 1800 are patterned using RIE.

Figure 19:
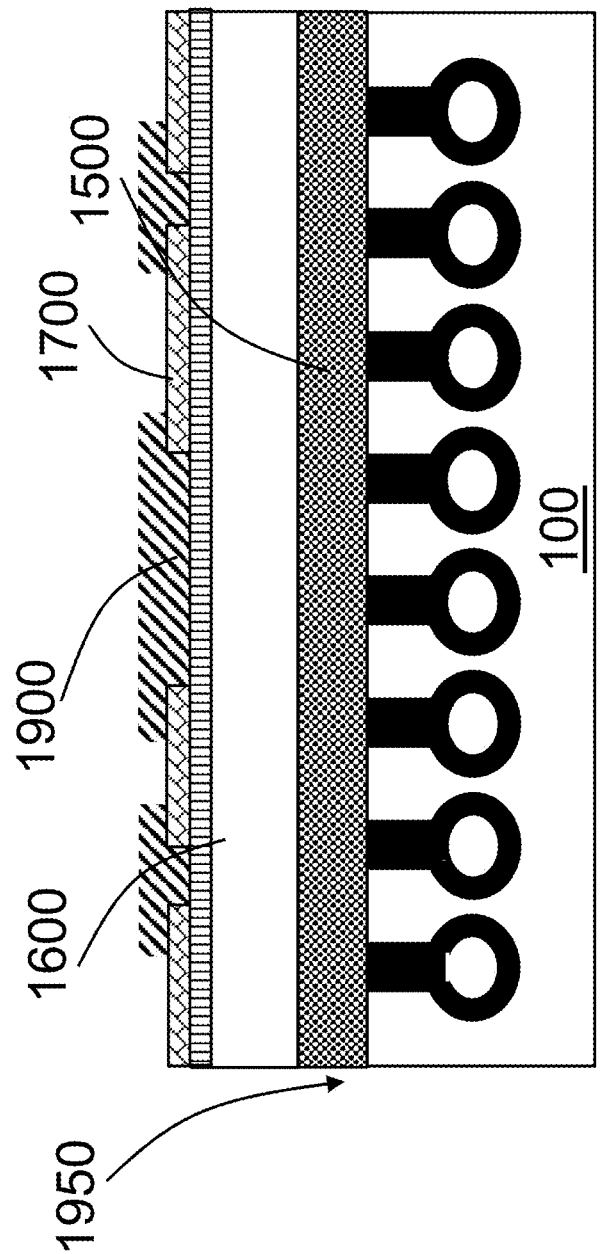
FIG. 19 illustrates patterned metal layer forming one electrode of a Schottky Barrier Diode over patterned dielectric isolation layer over an epitaxially grown layer over an epitaxially grown epitaxial layer with merged epitaxial lateral overgrowth (MELO) over array of carbon filled micro-voids in silicon carbide substrate in accordance with an example embodiment.

FIG. 19 is an illustration of a metal contact layer 1900 configured to form an electrode of the Schottky Diode in accordance with an example embodiment. In one embodiment, contact openings 1800 from FIG. 18 are covered with metal contact layer 1900. Metal contact layer 1900 is deposited using sputtering, e-beam evaporation, electrodeposition among other techniques and can also use a combination of metal deposition techniques. Metal contact layer 1900 may be patterned using lithography and etched. In addition, lift-off techniques may also be used for the deposition and patterning of metal contact layer 1900, as will be evident to those skilled in the art. Metal contact layer 1900 may be annealed or sintered to ensure good ohmic contact with ohmic contact region 1750 from FIG. 17. After formation of metal contact layer 1900, a passivation layer may be deposited and patterned to expose bond pads of the example device in accordance with the current invention. At this stage of the example embodiment, the fabrication of a semiconductor device such as the Schottky Barrier Diode is complete in epitaxial layer 1600 formed over epitaxial layer 1500 which overlies carbonized layer 900 of FIG. 9, carbonized layer 1200 of FIG. 12, or carbonized layer 1400 of FIG. 14 in plurality micro-voids 500 from FIG. 5 in silicon carbide substrate 100. In an example embodiment, front side metallization results in silicon carbide substrate 100 with Schottky Barrier Diode 1950.

Figure 20:
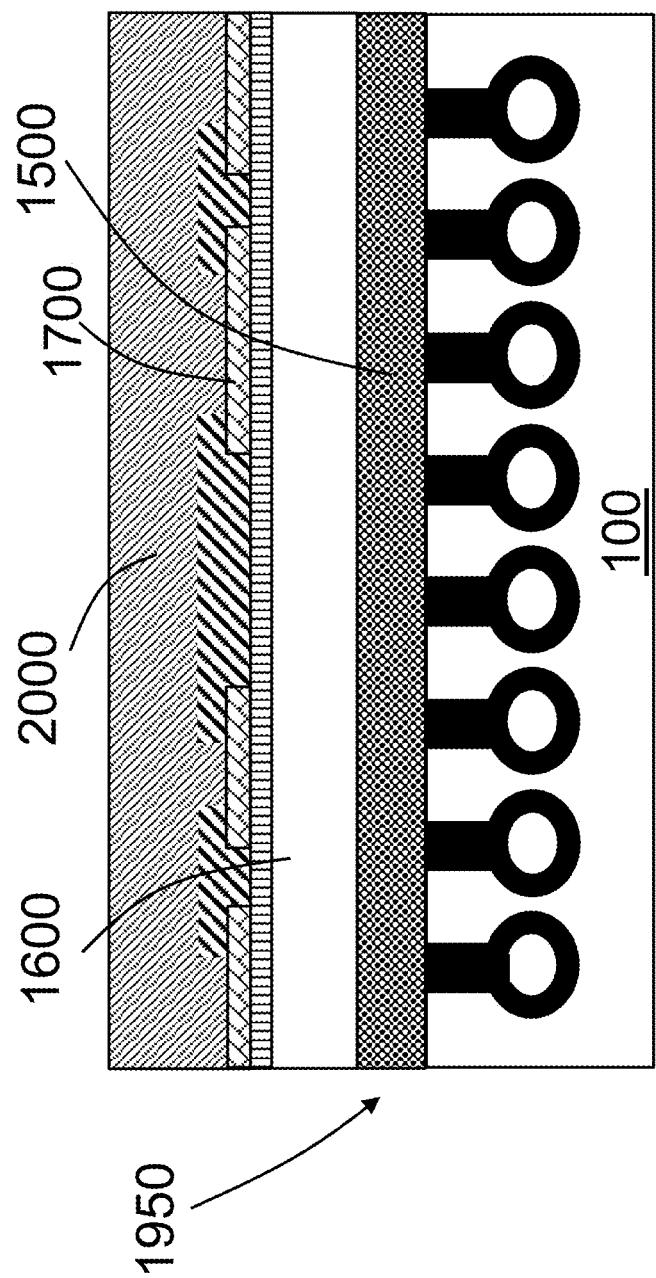
FIG. 20 illustrates a completed Schottky Barrier Diode formed in silicon carbide substrate temporarily bonded to a carrier wafer in accordance with an example embodiment.

FIG. 20 is an illustration of a carrier wafer 2000 temporarily coupled to silicon carbide substrate 100 with Schottky Barrier Diode 1950 in accordance with an example embodiment. In general, carrier wafer 2000 is a substrate used for handling epitaxial layer 1500 and epitaxial layer 1600. Silicon carbide substrate 100 with Schottky Barrier Diode 1950 is temporarily coupled to carrier wafer 2000 to enable an exfoliation process. The exfoliation process occurs at an exfoliation layer comprising plurality of micro-voids 500 of FIG. 5, one of carbonized layer 900 of FIG. 9, carbonized layer 1200 of FIG. 12, or carbonized layer 1400 of FIG. 14 within micro-voids 500, and plurality of pillars 510 of FIG. 6. In one embodiment, a plane of the exfoliation layer is substantially parallel to the surface of substrate 100. In one embodiment, silicon carbide substrate 100 with completed Schottky Barrier Diode 1950 is attached to carrier wafer 2000 by adhesives such as UV sensitive glue among others. In the example, epitaxial layer 1600 and epitaxial layer 1500 are coupled between silicon carbide substrate 100 and carrier wafer 2000. Carrier wafer 2000 may be borosilicate glass which is UV transparent and may be used with a UV curable adhesive for the bonding. Different methods of exfoliation may be used to separate semiconductor devices formed in device epitaxial layer 1600 overlying epitaxial layer 1500 from FIG. 16 coupled to carrier wafer 2000 along the plane of the exfoliation layer. As an example, the exfoliation process is achieved by using an electrostatic chuck to hold the assembly of silicon carbide substrate 100 with Schottky Barrier Diode 1950 and carrier wafer 2000 and applying normal and shear stresses to fracture the exfoliation layer comprising carbon layer 900 from FIG. 16 and plurality of pillars 510 of FIG. 5. In another example, the exfoliation process is done using thermal stresses to initiate fracture of the exfoliation layer comprising carbon layer 900 of FIG. 16 and plurality of pillars 510 of FIG. 5. A combination of techniques may also be used for used for the exfoliation process of silicon carbide substrate 100 with device epitaxial layer 1600 and epitaxial layer 1500. Note that the exfoliation process examples herein above would also work for the exfoliation layer comprising carbonized layer 1200 of FIG. 12 or carbonized layer 1400 of FIG. 14 within micro-voids 500 of FIG. 5 with plurality of pillars 510.

Figure 21:
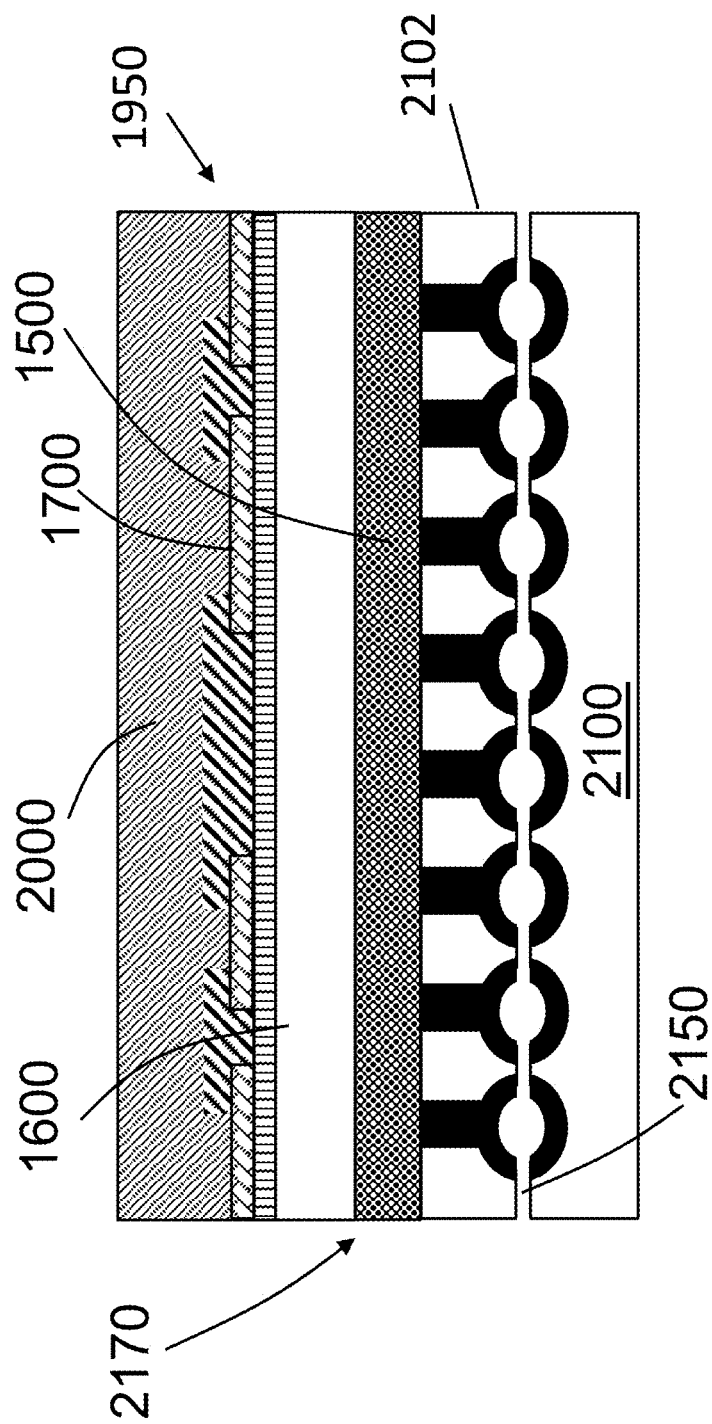
FIG. 21 illustrates exfoliation of Schottky Barrier Diode formed in an epitaxially grown layer over an epitaxially grown epitaxial layer with merged epitaxial lateral overgrowth (MELO) over array of carbon filled micro-voids in silicon carbide substrate in accordance with an example embodiment.

FIG. 21 is an illustration of a portion of silicon carbide substrate 2102 with Schottky Barrier Diode 1950 coupled to carrier wafer 2000 in accordance with an example embodiment. Thus, a silicon carbide substrate 2170 is formed after exfoliation along a fracture plane 2150 and separated from a remaining silicon carbide substrate 2100. In the example embodiment, silicon carbide substrate 2170 comprises epitaxial layer 1500 and epitaxial layer 1600 both formed of silicon carbide. In one embodiment, assembly of completed Schottky Barrier Diode 1950 fabricated in device epitaxial layer 1600 over epitaxial layer 1500 and temporarily coupled to carrier wafer 2000 is exfoliated from remaining silicon carbide substrate 2100 along the plane of carbon layer 900 from FIG. 9 filling plurality of micro-voids 500 from FIG. 5 along fracture plane 2150. Plurality of pillars 510 of FIG. 6 are also separated along fracture plane 2150 by the exfoliation process. FIG. 21 is not drawn to scale since thickness of remaining silicon carbide substrate 2100 is in the range of 300-400 micrometers, while the portion of silicon carbide substrate 2170 is in the range of 20-60 micrometers.

Figure 22:
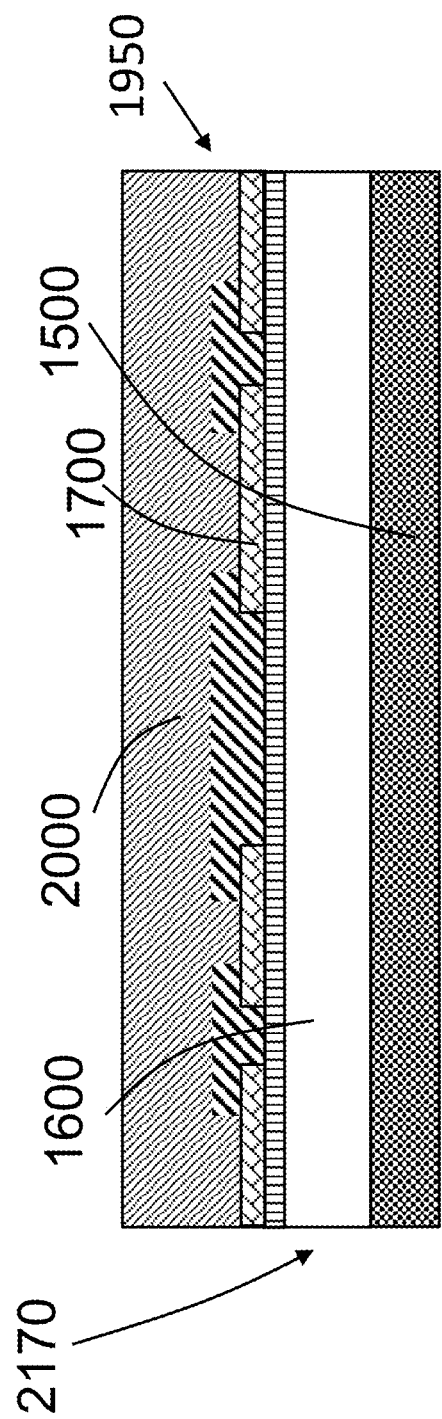
FIG. 22 illustrates an exfoliated Schottky Barrier Diode formed in an epitaxially grown layer over an epitaxially grown epitaxial layer with merged epitaxial lateral overgrowth (MELO) polished to remove portions of array of micro-voids, in accordance with an example embodiment.

FIG. 22 is an illustration of silicon carbide substrate 2170 in accordance with an example embodiment. Remaining silicon carbide substrate 2100 from FIG. 21 is polished to remove carbon layer 900 filling plurality of micro-voids 500 from FIG. 5 and plurality of pillars 510 of FIG. 6 after the exfoliation process is completed. In one embodiment, remaining silicon carbide substrate 2100 is reused again to form another silicon carbide substrate as disclosed herein above thereby saving substantial cost and time. 1. Silicon carbide substrate 2170 is polished to remove portion of silicon carbide substrate 2102 to expose a surface of epitaxial layer 1500. In on embodiment, a combination of fine grind and polishing may be used to expose a surface of epitaxial layer 1500. In the example embodiment, a silicon carbide substrate of a predetermined thickness can be formed using the process disclosed herein above to improve thermal transfer and lower resistance of a silicon carbide device while lowering manufacturing cost. Substantial savings occur by reusing remaining silicon carbide substrate 2100 multiple times in the formation of silicon carbide devices thereby reducing the number of silicon carbide substrates needed to be purchased.

Figure 23:
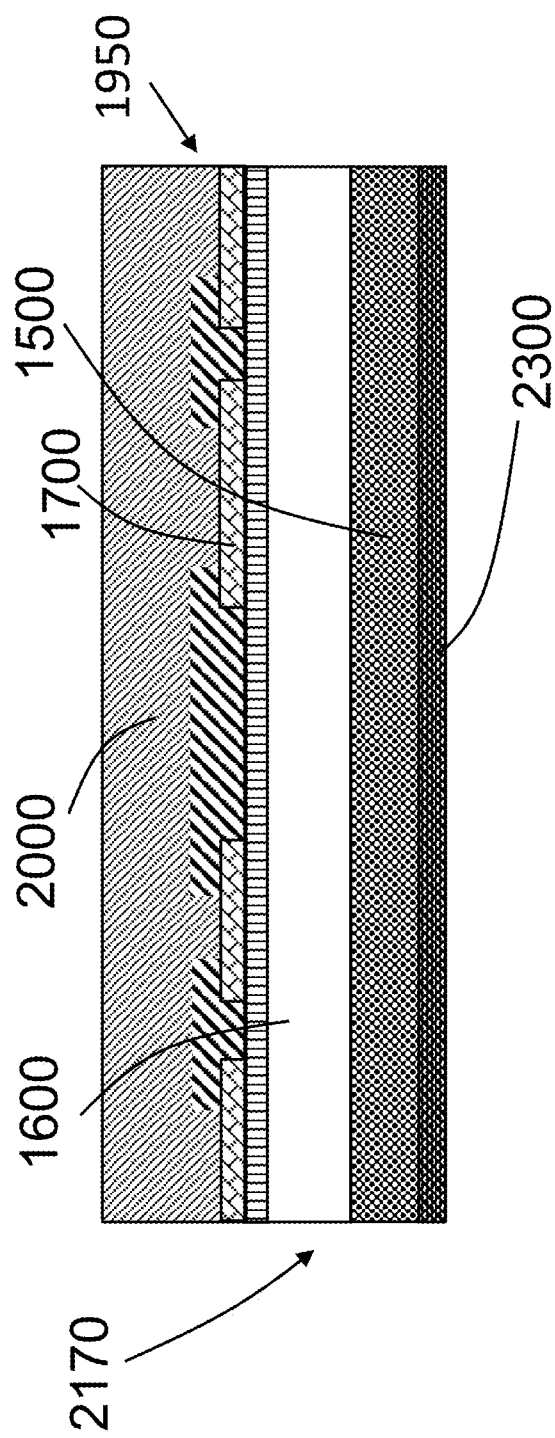
FIG. 23 illustrates the back side metallization for an exfoliated Schottky Barrier Diode formed in an epitaxially grown layer over an epitaxially grown epitaxial layer with merged epitaxial lateral overgrowth (MELO) in accordance with an example embodiment.

FIG. 23 is an illustration of a metal layer 2300 on a surface of epitaxial layer 1500 in accordance with an example embodiment. In one embodiment, silicon carbide substrate 2170 is coated with metal layer 2300 to form a backside contact of Schottky Barrier Diode 1950. In one embodiment, the surface of epitaxial layer 1500 of silicon carbide substrate 2170 is polished and metal layer 2300 is deposited to the surface of epitaxial layer 1500 with good ohmic contact using evaporation, sputtering and other methods of metal deposition. Epitaxial layer 1500 is formed with N+ doping to ensure good ohmic contact with metal layer 2300. Metals such as nickel, or combination of metals such as Ti/Ni/Au (Titanium/Nickel/Gold) may be used along with annealing to reduce contact resistance to surface of epitaxial layer 1500. In one embodiment, laser annealing may be used to reduce contact resistance of metal layer 2300.

Figure 24:
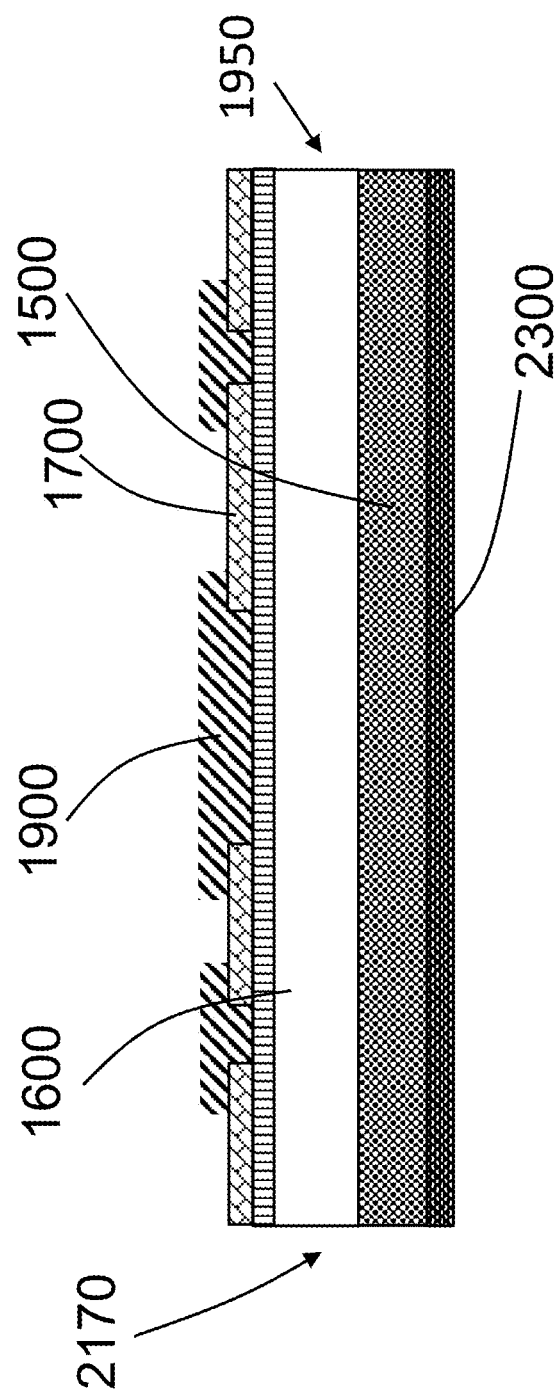
FIG. 24 illustrates a completed Schottky Barrier Diode formed in an epitaxially grown layer over an epitaxially grown epitaxial layer with merged epitaxial lateral overgrowth (MELO) exfoliated from a silicon carbide substrate, in accordance with an example embodiment.

FIG. 24 is an illustration of silicon carbide substrate 2170 with Schottky Barrier Diode 1950 separated from carrier wafer 2000 from FIG. 23 in accordance with an example embodiment. In one embodiment, after metal layer 2300 is deposited, the entire assembly comprising of silicon carbide substrate 2170 and carrier wafer 2000 is attached to a blue dicing tape. Carrier wafer 2000 is then separated from silicon carbide substrate 2170 which is attached to the dicing tape. In the example embodiment, silicon carbide substrate 2170 with completed Schottky Barrier Diode 1950 is diced and assembled in packages.

Figure 25:
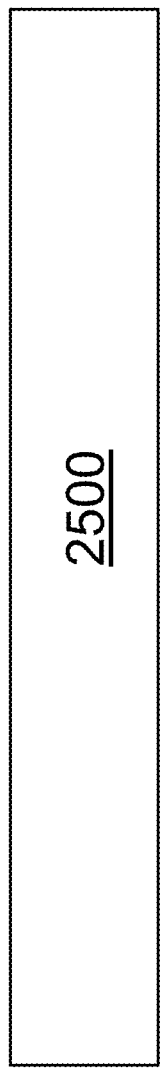
FIG. 25 illustrates a reclaimed silicon carbide substrate after polishing and exfoliation and ready for formation of silicon carbide semiconductor devices.

FIG. 25 is an illustration of a reclaimed silicon carbide substrate 2500 after performing the exfoliation process on remaining silicon carbide substrate 2100 from FIG. 21 in accordance with an example embodiment. After the exfoliation process separating silicon carbide substrate 2170 of FIG. 24 from remaining silicon carbide substrate 2100 from FIG. 21 is further processed to make silicon carbide substrate 2100 suitable for reuse. As previously disclosed herein above, silicon carbide substrate 2100 is a majority portion silicon carbide substrate 100 from FIG. 20 and is reclaimed by re-polishing a surface exposed to fracture plane 2150 from FIG. 21 such that a polished surface is suitable for formation of semiconductor devices using the current invention. The polishing of the surface of silicon carbide substrate 2100 to form reclaimed silicon carbide substrate 2500 is performed using CMP (chemical mechanical polishing), electrochemical polishing among other methods. Reclaimed silicon carbide substrate 2500 can be used for successive formation of semiconductor devices using the same silicon carbide substrate 100 but with a portion removed by each subsequent exfoliation process. By successive application of the current invention of formation of plurality of micro-voids 500 from FIG. 5 filled with carbon layer 900 from FIG. 9, epitaxial growth of epitaxial layer 1500, epitaxial growth of drift region in epitaxial layer 1600, device formation, exfoliation and re-polishing of the severed substrate, the same original silicon carbide substrate 100 may be re-used multiple times. By the successive application of the current invention as described by the example embodiment, the same original silicon carbide substrate 100 can be used for fabrication of silicon carbide semiconductor devices leading to significant reduction in the cost of fabrication of silicon carbide semiconductor devices. By application of the method of exfoliation using carbon layer filling plurality of micro-voids, silicon carbide devices can be fabricated with lower RDSon leading to higher electrical efficiency and lower thermal resistance.

Figure 26:
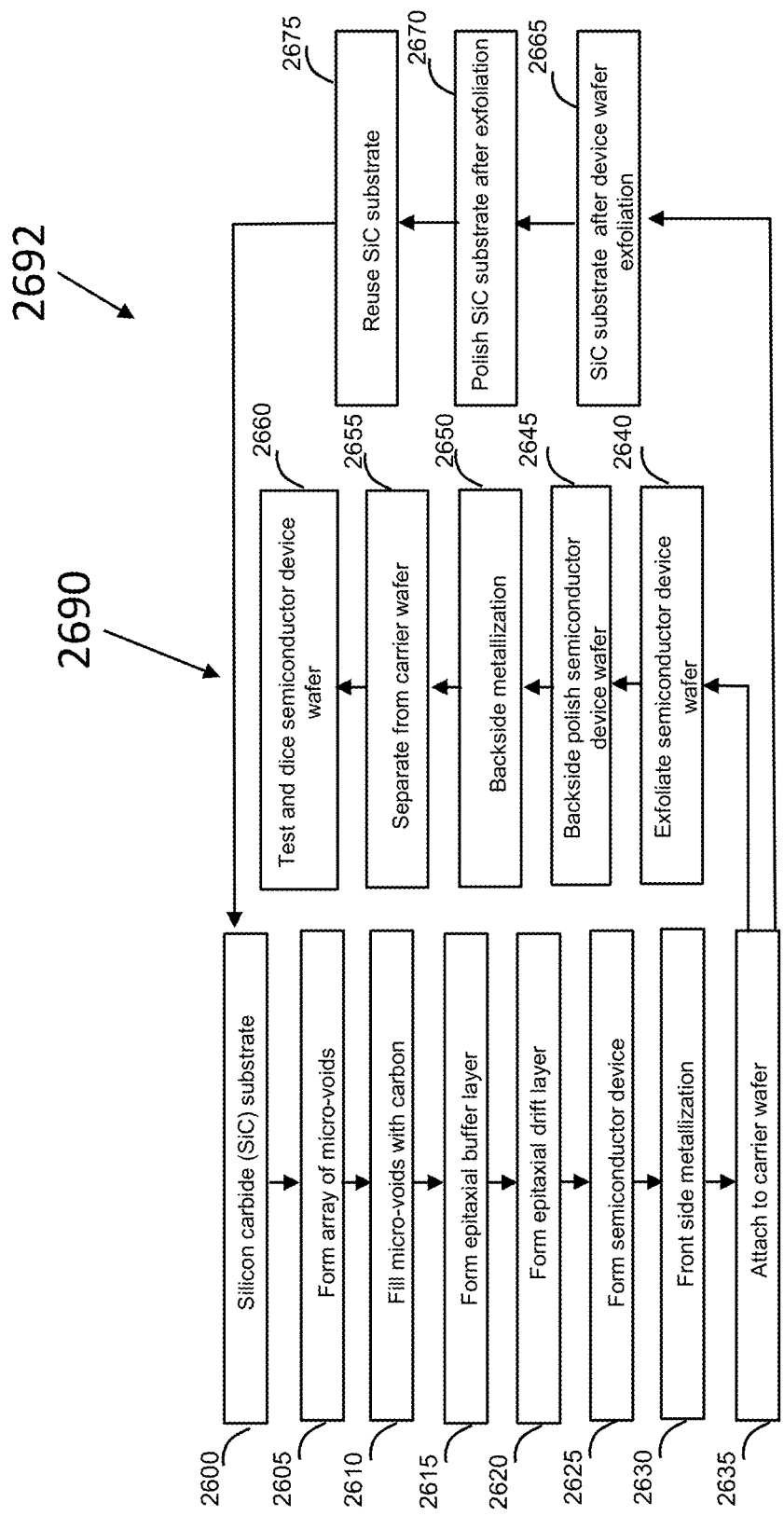
FIG. 26 shows a block diagram implementation of a Schottky Barrier Diode using a silicon carbide substrate in accordance with an example embodiment.

FIG. 26 is an illustration of a block diagram 2692 of an exfoliation process 2690 in accordance with an example embodiment. Substrate forming process and exfoliation process 2690 supports reuse of silicon carbide substrate 100 of FIG. 1 in the manufacture of semiconductor devices. The order of the blocks in block diagram in FIG. 26 is for illustrative purposes only and does not imply an order or show all the specific steps in the implementation of the invention as are known by one skilled in the art.

In one embodiment, blocks 2600, 2605, 2610, 2615, 2620, 2625, 2630, 2635, 2640, 2645, 2650, and 2655 comprises the formation of a substrate and exfoliation process 2690 to separate the substrate from the silicon carbide substrate. In the example, the substrate comprises at least a first silicon carbide epitaxial layer and a second epitaxial layer and semiconductor devices are formed in the substrate. In one embodiment, no semiconductor devices are formed in the silicon carbide substrate but the silicon carbide substrate is used to form the substrate comprising at least two epitaxial silicon carbide layers. In the block diagram 2692, block 2600 illustrates the silicon carbide substrate used in an example embodiment. In block 2605, an array of micro-voids is formed in silicon carbide substrate and filled with carbon as shown in block 2610. After filling array of micro-voids with carbon, buffer epitaxial layer is formed as shown in block 2615 followed by forming of epitaxial drift layer, as shown in block 2620. Buffer epitaxial layer and epitaxial drift layer comprise silicon carbide. Block 2625 illustrates the step of forming at least one semiconductor device. Block 2635 shows the front side metallization of the at least one semiconductor device. Block 2635 shows the step of attaching the completed semiconductor device wafer with front side metallization to a carrier wafer. The assembly of completed semiconductor device layer and carrier wafer is then subjected to the exfoliation process 2690. Block 2640 shows the substrate with at least one semiconductor device after exfoliation process 2690 such that the silicon carbide substrate is separated from the substrate comprising at least two silicon carbide epitaxial layers. Block 2645 shows the step of polishing backside of the substrate followed by block 2650 showing the step of backside metallization of the substrate. Block 2655 shows the step of separating completed the substrate from the carrier wafer followed by block 2660 showing the step of testing and dicing of the substrate. In the example, a plurality of semiconductor devices is formed on or in the substrate and these are diced to separate the semiconductor devices for packaging. Block 2665 shows the step of the portion of silicon carbide substrate after exfoliation of semiconductor device wafer as shown in block 2635. Block 2670 shows the step of polishing of silicon carbide substrate for reuse for multiple semiconductor devices as shown in block 2675. As mentioned herein above, only a fraction of the silicon carbide substrate is used in the formation of the substrate. A remaining portion of the silicon carbide substrate can be reused to form more substrates and more devices thus, extending the life of the silicon carbide substrate and forming the devices on the substrate or a controlled and predetermined thickness.

The descriptions disclosed herein below will call out components, materials, inputs, or outputs from FIGS. 1-26. In one embodiment, a semiconductor substrate is used for forming one or more semiconductor devices comprising a first silicon carbide epitaxial layer and a second silicon carbide epitaxial layer overlying the first silicon carbide epitaxial wherein the first silicon carbide epitaxial layer is grown overlying a surface of carbide substrate 100 comprising silicon carbide and carbon. In one embodiment, a first silicon carbide epitaxial layer is epitaxial layer 1500 and a second silicon carbide epitaxial layer is an epitaxial layer 1600. In one embodiment, epitaxial layer 1500 is grown overlying a surface of silicon carbon substrate 100 comprising silicon carbide and carbonized layer 900

In one embodiment, silicon carbide substrates 100 comprises a plurality of micro-voids 500 formed at or below a surface of silicon carbide substrate 100 wherein the plurality of micro-voids 500 are filled or partially filled with carbon. The plurality of micro-voids 500 are substantially parallel to the surface of silicon carbide substrate 100 and wherein the carbon within plurality of micro-voids 500 is configured to couple to the surface of silicon carbide substrate 100.

In one embodiment, silicon carbide substrate 100 with plurality of micro-voids 500 is configured to form plurality of pillars 510 in silicon carbide substrate 100 such that they separate during an exfoliation process that leaves a portion of silicon carbide substrate 2102 coupled with first silicon carbide epitaxial layer forming epitaxial layer 1500 and a remaining silicon carbide substrate 2100 that can be configured for reuse.

In one embodiment, silicon carbide substrate 100 with plurality of micro-voids 500 and plurality of pillars 510 with carbon filling or partially filling plurality of micro-voids 500 is configured to separate during the exfoliation process.

In one embodiment, a plurality of trenches 302 are formed in silicon carbide substrate 100. Plurality of trenches 302 are configured to receive etchant such that silicon carbide substrate 100 is etched to form plurality of micro-voids 500 below the surface, wherein adjacent micro-voids of plurality of micro-voids 500 are spaced a predetermined distance and where plurality of micro-voids 500 are formed to a predetermined depth below the surface of silicon carbide substrate 100 along a plane substantially parallel to surface of silicon carbide substrate 100.

In one embodiment, a polymer 700 is configured to be deposited within plurality of micro-voids 500 to fill or partially fill plurality of micro-voids 500 in silicon carbide substrate 100. In one embodiment, polymer 700 is configured to be pyrolyzed. In one embodiment, polymer 700 is Parylene C.

In one embodiment, a semiconductor substrate is used for forming one or more semiconductor devices comprising a first silicon carbide epitaxial layer and a second silicon carbide epitaxial layer overlying the first silicon carbide epitaxial layer wherein the first silicon carbide epitaxial layer is grown overlying a surface of carbide substrate 100 comprising silicon carbide and carbon. In one embodiment, a first silicon carbide epitaxial layer is epitaxial layer 1500 and a second silicon carbide epitaxial layer is an epitaxial layer 1600. In one embodiment, one or more semiconductor devices are on or within second silicon carbide epitaxial layer. In one embodiment, second silicon carbide epitaxial layer is epitaxial layer 1600. In one embodiment, a metal layer 2300 is formed on a surface of first silicon carbide epitaxial layer. In one embodiment, first silicon carbide epitaxial layer is epitaxial layer 1500.

In one embodiment, a first silicon carbide epitaxial layer is configured to grow with a crystalline structure at the surface of silicon carbide substrate 100 wherein first carbide epitaxial layer is formed using merged epitaxial lateral overgrowth (MELO). In one embodiment, first silicon carbide epitaxial layer is epitaxial layer 1500.

In one embodiment, a semiconductor substrate configured to form one or more semiconductor devices comprises a silicon carbide substrate 100 have an exfoliation layer comprising carbon and silicon carbide where the exfoliation layer is a predetermined distance from a surface of silicon carbide substrate 100 and wherein the exfoliation layer is substantially planar to the surface of silicon carbide substrate 100. In one embodiment, carbon in silicon carbide substrate 100 is carbonized layer 900.

In one embodiment, a first silicon carbide epitaxial layer is formed overlying silicon carbide substrate 100 with a second silicon carbide epitaxial layer overlying first silicon carbide epitaxial layer wherein an exfoliation process separates silicon carbide substrate 100 from first silicon carbide epitaxial layer leaving a portion of silicon carbide substrate 2102 coupled to first silicon carbide epitaxial layer and a remaining silicon carbide substrate 2100 that can be configured for reuse. In one embodiment, first silicon carbide epitaxial layer is epitaxial layer 1500 and second silicon carbide epitaxial layer is epitaxial layer 1600.

In one embodiment, portion of silicon carbide substrate 2102 coupled to first epitaxial layer is removed thereby leaving semiconductor substrate comprising first silicon carbide epitaxial layer and second silicon carbide epitaxial layer. In one embodiment, first silicon carbide epitaxial layer is epitaxial layer 1500 and second silicon carbide epitaxial layer is epitaxial layer 1600.

In one embodiment, the surface of first silicon carbide epitaxial layer includes a metal layer 2300. In one embodiment, a device is formed in the second silicon carbide epitaxial layer. In one embodiment, first silicon carbide epitaxial layer is epitaxial layer 1500 and second epitaxial layer is epitaxial layer 1600.

In one embodiment, the exfoliation process is configured to separate at the exfoliation layer.

In one embodiment, the surface of silicon carbide substrate 100 comprises carbon and silicon carbide and wherein the first silicon carbide epitaxial layer is grown having crystalline structure of the silicon carbide substrate 100. In one embodiment, first silicon carbide epitaxial layer is epitaxial layer 1500 and is formed using merged epitaxial lateral overgrowth (MELO).

In one embodiment, a method of forming a semiconductor substrate configured for forming one or more semiconductor devices is described, comprising providing a substrate having a surface comprising silicon carbide and carbon, forming a first silicon carbide epitaxial layer on the surface of the substrate such that the first silicon carbide epitaxial layer is configured to grow vertically and laterally over the surface of the substrate; forming a second silicon carbide epitaxial layer overlying the first epitaxial layer; exfoliating the first silicon carbide epitaxial layer from the substrate wherein exfoliation occurs a predetermined distance below the surface of the substrate thereby leaving a portion of the substrate coupled to the first silicon carbide epitaxial layer and a remaining substrate; and removing the portion of the substrate from the first silicon carbide epitaxial layer such the semiconductor substrate comprises the first silicon carbide epitaxial layer and the second silicon carbide epitaxial layer; forming the one or more semiconductor devices overlying or within the second silicon carbide epitaxial layer; and reusing the remaining substrate wherein the remaining substrate is prepared for reuse. In one embodiment, semiconductor substrate is silicon carbide substrate 100, first silicon carbide epitaxial layer is epitaxial layer 1500, second silicon carbide epitaxial layer is epitaxial layer 1600.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

What is claimed is:

1. A semiconductor substrate for forming one or more semiconductor devices comprising:
    a first silicon carbide epitaxial layer; and
    a second silicon carbide epitaxial layer overlying the first silicon carbide epitaxial layer wherein the first silicon carbide epitaxial layer is grown overlying a surface of a silicon carbide substrate comprising silicon carbide and carbon, wherein the first silicon carbide epitaxial layer is configured to grow with a crystalline structure at the surface of the silicon carbide substrate, and wherein the first silicon carbide epitaxial layer is formed using merged epitaxial lateral overgrowth (MELO).

2. The semiconductor substrate of claim 1 wherein a plurality of micro-voids are formed at or below a surface of the silicon carbide substrate, wherein the plurality of micro-voids are filled or partially filled with carbon, wherein the plurality of micro-voids are substantially parallel to the surface of the silicon carbide substrate, and wherein the carbon within the plurality of micro-voids is configured to couple to the surface of the silicon carbide substrate.

3. The semiconductor substrate of claim 2 wherein the plurality of micro-voids is configured to form a plurality of pillars in the silicon carbide substrate that are configured to separate during an exfoliation process that leaves a portion of the silicon carbide substrate coupled to the first silicon carbide epitaxial layer and a remaining silicon substrate that can be configured for reuse.

4. The semiconductor substrate of claim 2 wherein a plurality of trenches are formed in the silicon carbide substrate.

5. The semiconductor substrate of claim 2 wherein a surface of the first epitaxial layer has a crystalline structure identical to the silicon carbide substrate.

6. The semiconductor substrate of claim 5 wherein the plurality of trenches are configured to receive etchant such that the silicon carbide substrate is etched to form the plurality of micro-voids below the surface, wherein adjacent micro-voids of the plurality of micro-voids are spaced a predetermined distance apart, and wherein the plurality of micro-voids are formed to a predetermined depth below the surface of the silicon carbide substrate along a plane substantially parallel to the surface of the silicon carbide substrate.

7. The semiconductor substrate of claim 6 wherein a polymer is configured to be deposited within the plurality of micro-voids to fill or partially fill the plurality of micro-voids with the polymer.

8. The semiconductor substrate of claim 7 wherein the polymer is configured to be pyrolyzed.

9. The semiconductor substrate of claim 7 wherein the polymer is Parylene C.

10. The semiconductor substrate of claim 1 wherein one or more semiconductor devices are formed in or overlying the second silicon carbide epitaxial layer.

11. The semiconductor substrate of claim 1 further including a metal layer formed on a surface of the first silicon carbide epitaxial layer.

12. The semiconductor substrate of claim 1 wherein a surface of of the silicon carbide substrate is polished after separation to form a reclaimed silicon carbide wafer and wherein the reclaimed silicon carbide wafer is reused.

13. A semiconductor substrate for forming one or more semiconductor devices comprising:
- a silicon carbide substrate having an exfoliation layer comprising carbon and silicon carbide wherein the exfoliation layer is a predetermined distance from a surface of the silicon carbide substrate and wherein the exfoliation layer is substantially planar to the surface of the silicon carbide substrate;
- a first silicon carbide epitaxial layer formed overlying the silicon carbide substrate; and
- a second silicon carbide epitaxial layer formed overlying the first silicon carbide epitaxial layer wherein an exfoliation process separates the silicon carbide substrate from the first silicon carbide epitaxial layer leaving a portion of the silicon carbide substrate coupled to the first silicon carbide epitaxial layer and a remaining silicon carbide substrate that can be configured for reuse, wherein the surface of the silicon carbide substrate comprises carbon and silicon carbide, and wherein the first silicon carbide epitaxial layer is grown having a crystalline structure of the silicon carbide substrate, and wherein the first silicon carbide epitaxial layer is formed using merged epitaxial lateral overgrowth (MELO).

14. The semiconductor substrate of claim 13 wherein an exposed surface of the first silicon carbide epitaxial layer is polished after separation by the exfoliation process.

15. The semiconductor substrate of claim 14 further including a metal layer formed on the exposed surface of the first silicon carbide epitaxial layer.

16. The semiconductor substrate of claim 13 wherein a plurality of devices is are formed in or overlying the second silicon carbide epitaxial layer.

17. The semiconductor substrate of claim 16 wherein the first and second epitaxial layers are separated from the silicon carbide substrate along a plane of the exfoliation layer.

18. The semiconductor substrate of claim 16 wherein the exfoliation process includes thermal or mechanical processes applied to the exfoliation layer to support separation.

19. The semiconductor substrate of claim 13 wherein lateral fronts of epitaxial regions of the first epitaxial layer grow laterally and vertically on the surface of silicon carbide substrate thereby merging to cover micro-voids in the silicon carbide substrate.

20. The semiconductor substrate of claim 19 wherein a surface of the first epitaxial layer overlies the silicon carbide substrate.

\* \* \* \* \*